(12) United States Patent
Tohlen et al.

(10) Patent No.: US 11,812,039 B2
(45) Date of Patent: *Nov. 7, 2023

(54) ELECTRONIC DEVICE AND METHOD FOR COMPRESSING VIDEO DATA

(71) Applicant: HONEYWELL FEDERAL MANUFACTURING & TECHNOLOGIES, LLC, Kansas City, MO (US)

(72) Inventors: Michael Aaron Tohlen, Lee's Summit, MO (US); Mitchell Hedges Morrow, Overland Park, KS (US); Joshua J. Miller, Overland Park, KS (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/708,542

(22) Filed: Mar. 30, 2022

(65) Prior Publication Data

US 2022/0256173 A1   Aug. 11, 2022

Related U.S. Application Data

(63) Continuation of application No. 17/175,919, filed on Feb. 15, 2021, now Pat. No. 11,317,103, which is a continuation-in-part of application No. 16/860,177, filed on Apr. 28, 2020, now Pat. No. 10,938,414, and a continuation-in-part of application No. 16/861,301, (Continued)

(51) Int. Cl.
*H04N 19/184* (2014.01)
*H04N 19/172* (2014.01)
*H04N 19/136* (2014.01)
*H04N 19/132* (2014.01)
*H04N 19/182* (2014.01)
*H04N 19/587* (2014.01)
*H03M 7/30* (2006.01)

(52) U.S. Cl.
CPC ........ *H04N 19/184* (2014.11); *H04N 19/132* (2014.11); *H04N 19/136* (2014.11); *H04N 19/172* (2014.11); *H04N 19/182* (2014.11); *H04N 19/587* (2014.11); *H03M 7/3059* (2013.01)

(58) Field of Classification Search
CPC . H03M 7/6058; H03M 7/3059; G06F 3/0608; G06F 3/0673; G06F 3/0661; H04N 19/184; H04N 19/132; H04N 19/136; H04N 19/172; H04N 19/182
USPC .......................................................... 341/87
See application file for complete search history.

(56) References Cited

U.S. PATENT DOCUMENTS 9,406,112 B2 *  8/2016  Banterle ............... H04N 19/33
10,567,771 B2 *  2/2020  Mishra ............... H04N 19/136

* cited by examiner

*Primary Examiner* — Khai M Nguyen
(74) *Attorney, Agent, or Firm* — Hovey Williams LLP

(57) ABSTRACT

A computer-implemented method for compressing video data comprises receiving a sequence of video data values, each video data value being a digital value from a successive one of a plurality of pixels that form a video sensor, the sequence of video data values resulting from successive frames of video captured by the video sensor; extracting the video data values for each pixel in turn to create a plurality of pixel data streams, each pixel data stream including the video data value for each frame of captured video for the pixel; and applying data compression to each pixel data stream to create compressed data for each pixel data stream.

20 Claims, 27 Drawing Sheets

Related U.S. Application Data filed on Apr. 29, 2020, now Pat. No. 10,924,131, and a continuation-in-part of application No. 16/862,806, filed on Apr. 30, 2020, now Pat. No. 11,038,527, said application No. 16/860,177 is a continuation-in-part of application No. 16/554,757, filed on Aug. 29, 2019, now abandoned, said application No. 16/861,301 is a continuation-in-part of application No. 16/554,757, filed on Aug. 29, 2019, now abandoned, said application No. 16/862,806 is a continuation-in-part of application No. 16/554,757, filed on Aug. 29, 2019, now abandoned, which is a continuation of application No. 16/150,355, filed on Oct. 3, 2018, now Pat. No. 10,447,297.

INPUTAMPLITUDE

| 0 | S0 |
|---|---|
| 1 | S1 |
| 2 | S2 |
| ⋮ | ⋮ |
| n-1 | Sn-1 |

INPUTTIME

| 0 | t0 |
|---|---|
| 1 | t1 |
| 2 | t2 |
| ⋮ | ⋮ |
| n-1 | tn-1 |

FIG. 5

DIFFERENCE

| 0 | \| S1 - S0 \| |
|---|---|
| 1 | \| S2 - S1 \| |
| 2 | \| S3 - S2 \| |
| ⋮ | ⋮ |
| n-2 | \| Sn-1 - Sn-2 \| |

FIG. 6

OUTPUTAMPLITUDE

| 0 | S0 |
|---|---|
| 1 | S1 |
| 2 | S4 |
| ⋮ | ⋮ |
| n-1 | S20 |

OUTPUTTIME

| 0 | t0 |
|---|---|
| 1 | t1 |
| 2 | t4 |
| ⋮ | ⋮ |
| n-1 | t20 |

FIG. 7

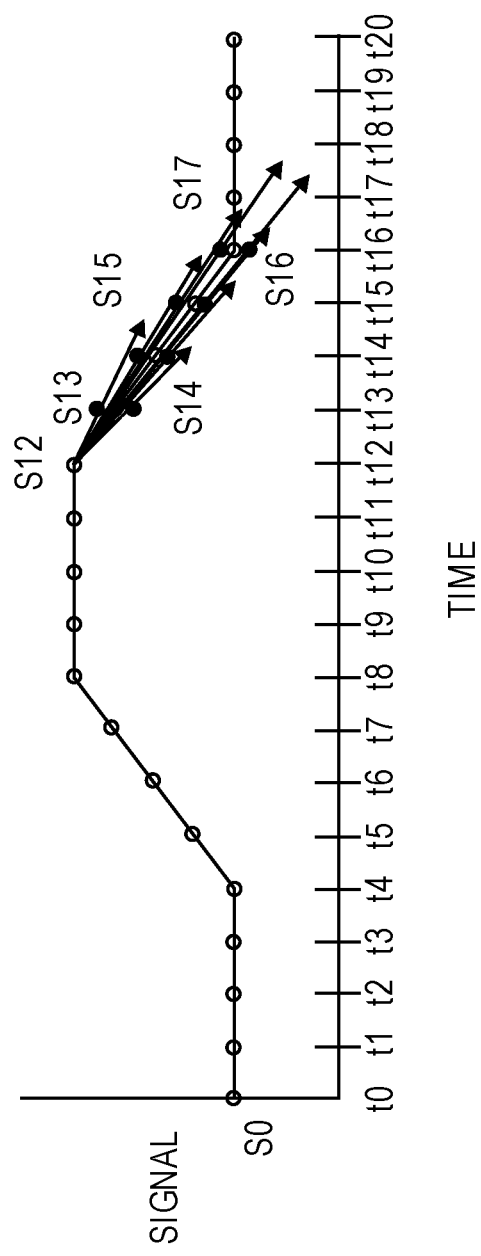
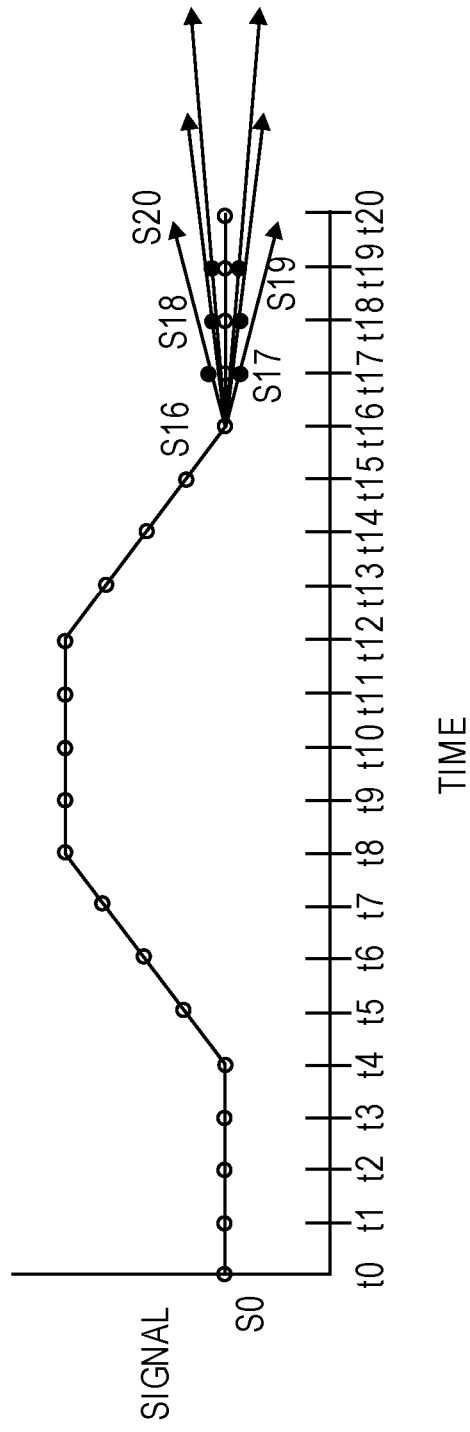

*VIDEO DATA STREAM BEFORE PIXEL DATA EXTRACTION*
FRAME 1:  P(1,1), P(2,1), P(3,1), ..., P(24,1), P(1,2), P(2,2), P(3,2), ..., P(24,14)
FRAME 2:  P(1,1), P(2,1), P(3,1), ..., P(24,1), P(1,2), P(2,2), P(3,2), ..., P(24,14)
FRAME 3:  P(1,1), P(2,1), P(3,1), ..., P(24,1), P(1,2), P(2,2), P(3,2), ..., P(24,14)
⋮
FRAME N:  P(1,1), P(2,1), P(3,1), ..., P(24,1), P(1,2), P(2,2), P(3,2), ..., P(24,14)

*PIXEL DATA STREAMS AFTER
PIXEL DATA EXTRACTION*
PIXEL (1,1):   F(1), F(2), F(3), ..., F(N)
PIXEL (2,1):   F(1), F(2), F(3), ..., F(N)
PIXEL (3,1):   F(1), F(2), F(3), ..., F(N)
⋮
PIXEL (24,14): F(1), F(2), F(3), ..., F(N)

*SEGMENTED PIXEL DATA STREAMS*
*AFTER PIXEL DATA EXTRACTION*

PIXEL (1,1):  | F(1), F(2), F(3), ..., F(30) | F(30), F(31), F(32), F(33), ..., F(60) | F(60), F(61), F(62), F(63), ..., F(90) |
                      SEGMENT 1                           SEGMENT 2                              SEGMENT 3

PIXEL (2,1):  | F(1), F(2), F(3), ..., F(30) | F(30), F(31), F(32), F(33), ..., F(60) | F(60), F(61), F(62), F(63), ..., F(90) |
                      SEGMENT 1                           SEGMENT 2                              SEGMENT 3

PIXEL (3,1):  | F(1), F(2), F(3), ..., F(30) | F(30), F(31), F(32), F(33), ..., F(60) | F(60), F(61), F(62), F(63), ..., F(90) |
                      SEGMENT 1                           SEGMENT 2                              SEGMENT 3

⋮

PIXEL (24,14):| F(1), F(2), F(3), ..., F(30) | F(30), F(31), F(32), F(33), ..., F(60) | F(60), F(61), F(62), F(63), ..., F(90) |
                      SEGMENT 1                           SEGMENT 2                              SEGMENT 3

FIG. 31

*COMPRESSED DATA OUTPUT FROM DATA COMPRESSION ELEMENT*
PIXEL (1,1):   F(1), F(2), F(3), F(8), F(10), F(15), ..., F(N)
PIXEL (2,1):   F(1), F(2), F(5), F(9), F(10), F(14), ..., F(N)
PIXEL (3,1):   F(1), F(2), F(4), F(6), F(11), F(12), ..., F(N)
⋮
PIXEL (24,14): F(1), F(2), F(3), F(5), F(11), F(18), ..., F(N)

FIG. 32

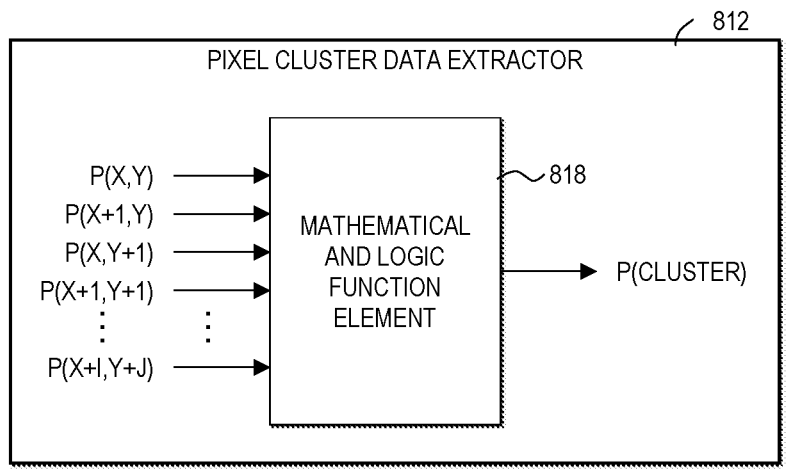

FIG. 34

ELECTRONIC DEVICE AND METHOD FOR COMPRESSING VIDEO DATA

RELATED APPLICATION

The current patent application is a continuation patent application which claims priority benefit, with regard to all common subject matter, to U.S. patent application Ser. No. 17/175,919, entitled "ELECTRONIC DEVICE AND METHOD FOR COMPRESSING VIDEO DATA", and filed Feb. 15, 2021, which is a continuation in part patent application that claims priority benefit, with regard to all common subject matter, to U.S. patent application Ser. No. 16/860,177, entitled "ELECTRONIC DEVICE AND METHOD FOR COMPRESSING SAMPLED DATA", and filed Apr. 28, 2020, U.S. patent application Ser. No. 16/861,301, entitled "ELECTRONIC DEVICE AND METHOD FOR COMPRESSING SAMPLED DATA", and filed Apr. 29, 2020, and U.S. patent application Ser. No. 16/862,806, entitled "ELECTRONIC DEVICE AND METHOD FOR COMPRESSING SAMPLED DATA", and filed Apr. 30, 2020, each of which is a continuation-in-part patent application that claims priority benefit, with regard to all common subject matter, to U.S. patent application Ser. No. 16/554,757, entitled "ELECTRONIC DEVICE AND METHOD FOR COMPRESSING SAMPLED DATA", and filed Aug. 29, 2019, which is a continuation patent application that claims priority benefit, with regard to all common subject matter, to U.S. patent application Ser. No. 16/150,355, now U.S. Pat. No. 10,447,297, entitled "ELECTRONIC DEVICE AND METHOD FOR COMPRESSING SAMPLED DATA", and filed Oct. 3, 2018. The listed earlier-filed patent applications are hereby incorporated by reference, in their entireties, into the current patent application.

STATEMENT REGARDING FEDERALLY-SPONSORED RESEARCH OR DEVELOPMENT

This invention was made with Government support under Contract No.: DE-NA0002839 awarded by the United States Department of Energy/National Nuclear Security Administration. The Government has certain rights in the invention.

FIELD OF THE INVENTION

Embodiments of the current invention relate to electronic devices, systems, and methods for compressing sampled data.

DESCRIPTION OF THE RELATED ART

Capturing and recording a value of a signal or waveform at regular time intervals, a process known as "sampling", often results in large amounts of sampled data. Sampled data may be captured from, or come in the form of, audio signals, video signals, video data, sensor data, and the like. Typically, it is desirable to compress, or reduce, the sampled data before storing or transmitting it so that the sampled data takes up less storage space, requires less communication bandwidth to transmit, or results in a shorter transmission time. Data compression techniques, such as aperture sampling, may reduce the sampled data by capturing significant changes in a signal or waveform's point-to-point amplitude. However, these techniques might not provide sufficient compression of the ever-increasing amount of media content generated by ubiquitous electronic devices and other sources. The result is a greater than necessary amount of storage space being consumed and increased requirements of bandwidth and transmission time.

SUMMARY OF THE INVENTION

Embodiments of the current invention address one or more of the above-mentioned problems and provide methods and systems for compressing video data which involves compressing the video data for each individual pixel as opposed to compressing an entire frame of video data. An exemplary method broadly comprises receiving a sequence of video data values, each video data value being a digital value from a successive one of a plurality of pixels that form a video sensor, the sequence of video data values resulting from successive frames of video captured by the video sensor; extracting the video data values for each pixel in turn to create a plurality of pixel data streams, each pixel data stream including the video data value for each frame of captured video for the pixel; and applying data compression to each pixel data stream to create compressed data for each pixel data stream.

An exemplary system broadly comprises a pixel data extractor configured to extract the video data values for each pixel in turn to create a plurality of pixel data streams, each pixel data stream including the video data value for each frame of captured video for the pixel; and a data compression element configured to compress each pixel data stream to create compressed data for each pixel data stream.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein.

Figure 2:
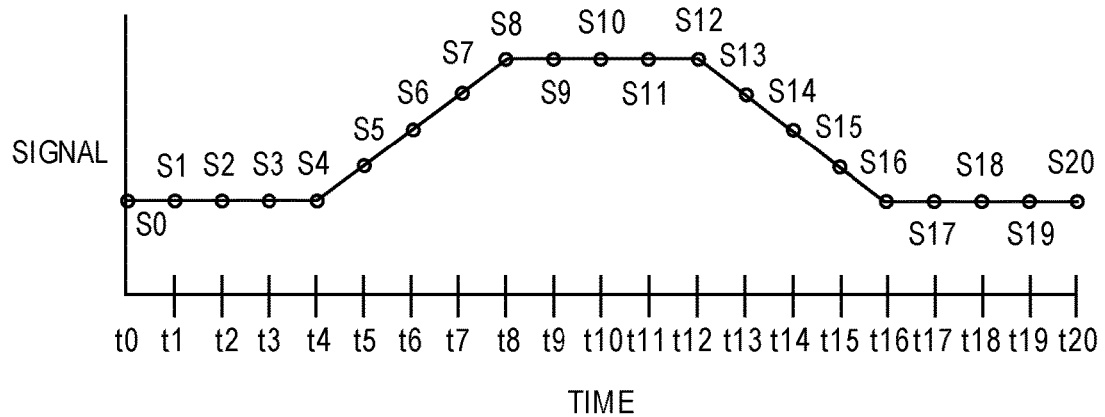
FIG. 2 is a plot of a signal vs. time, the plot including a plurality of sampled data points and sampled times.
Figure 4A:
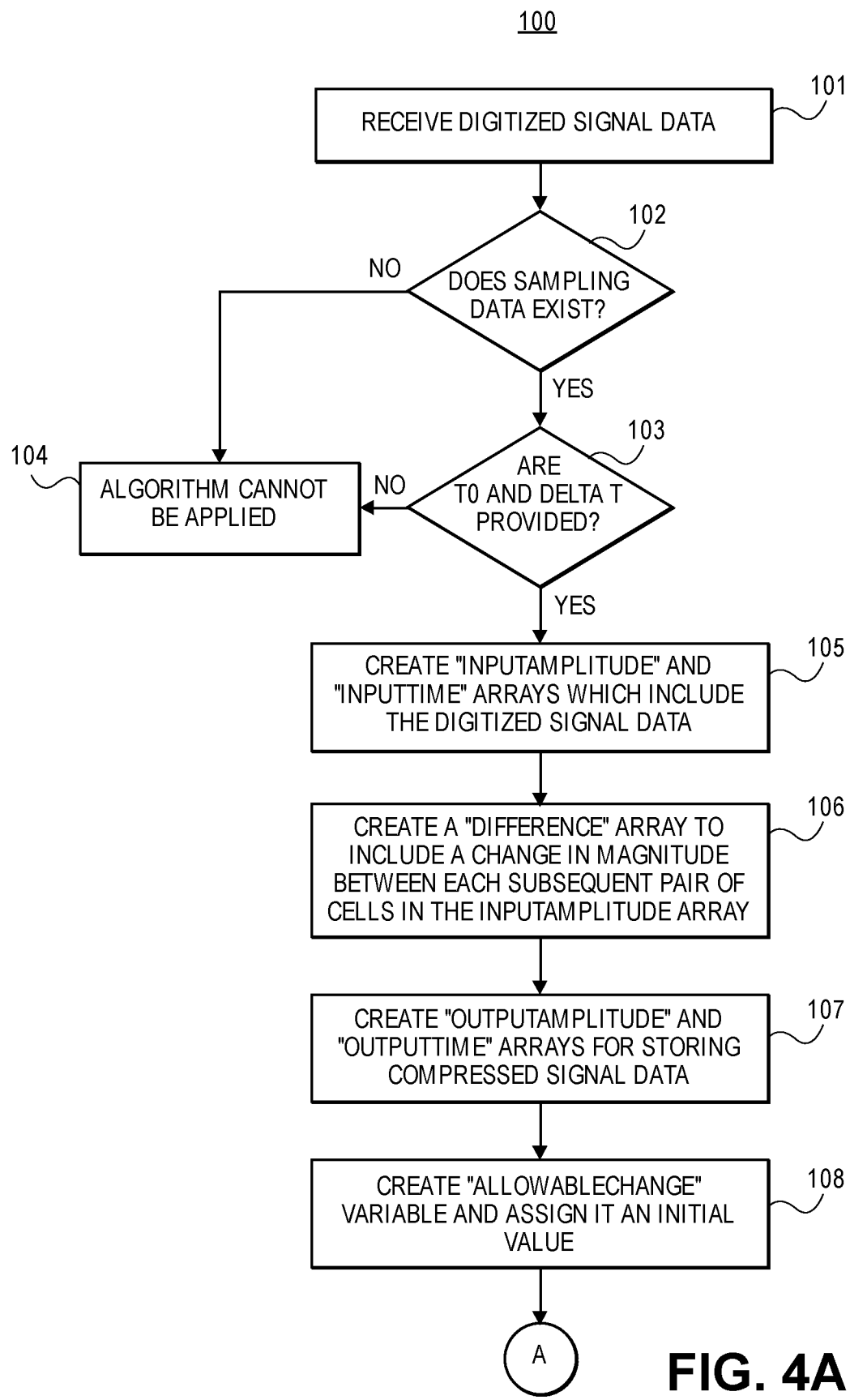
Figure 4B:
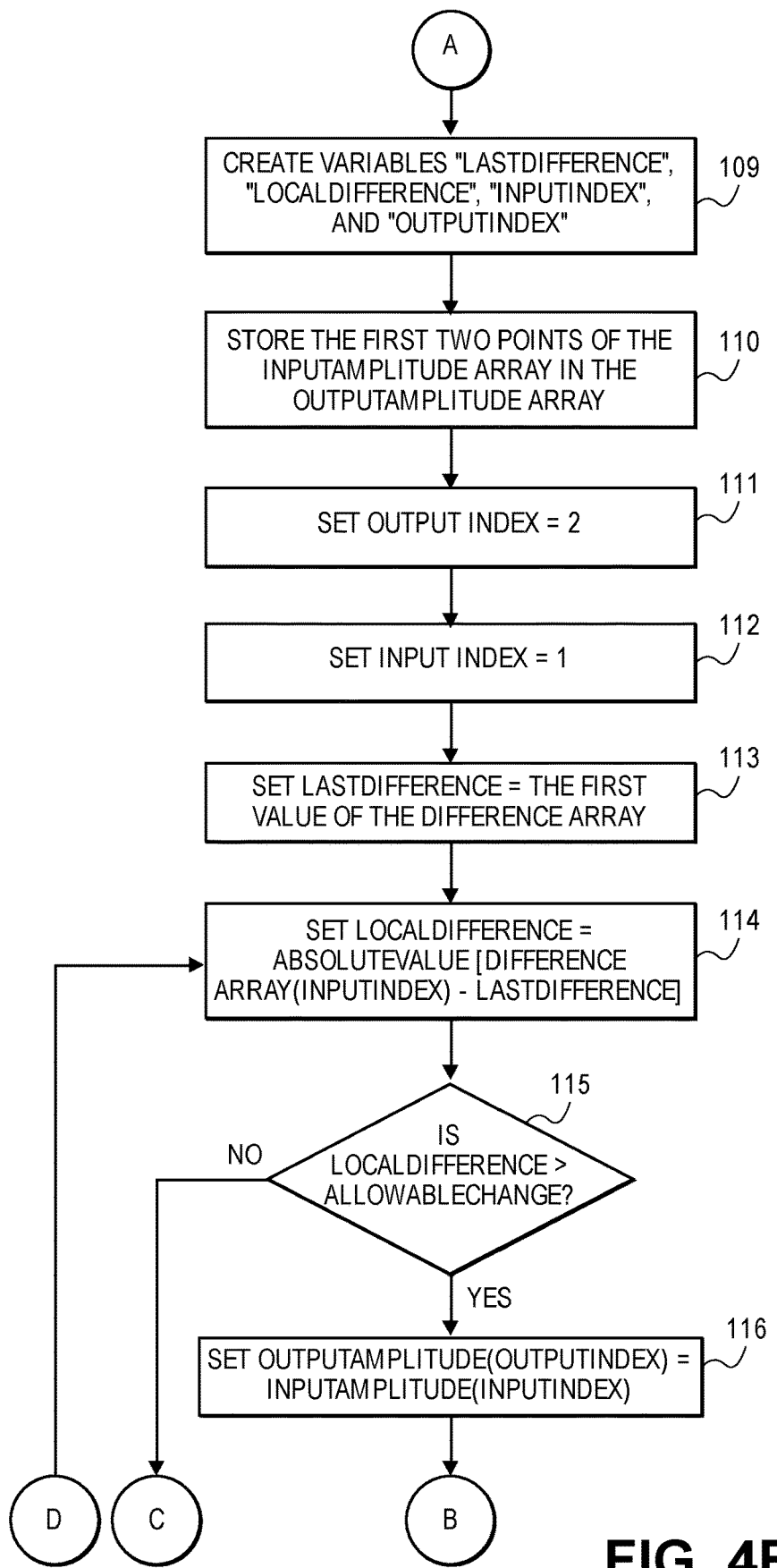
Figure 4C:
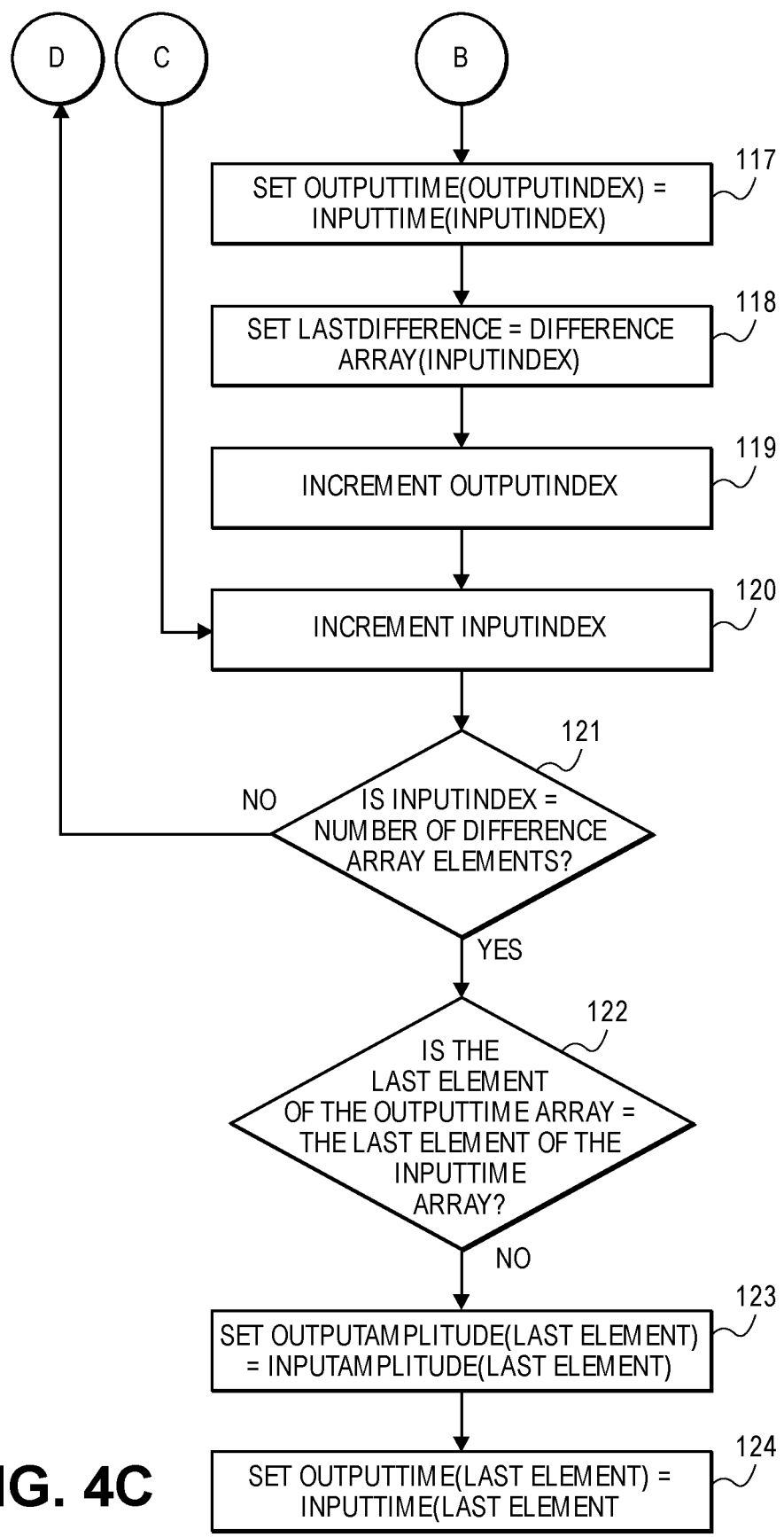
Figure 8:
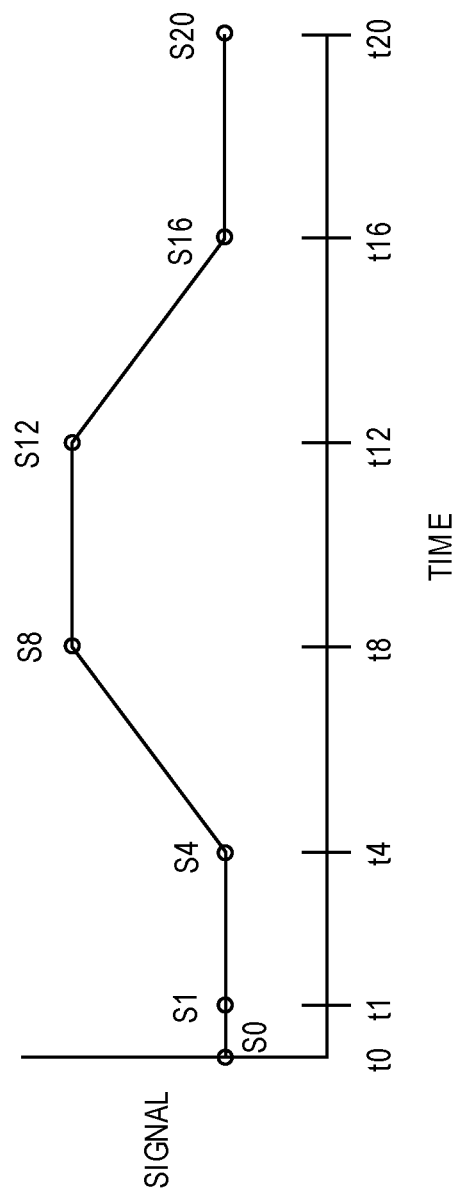
Figure 9:
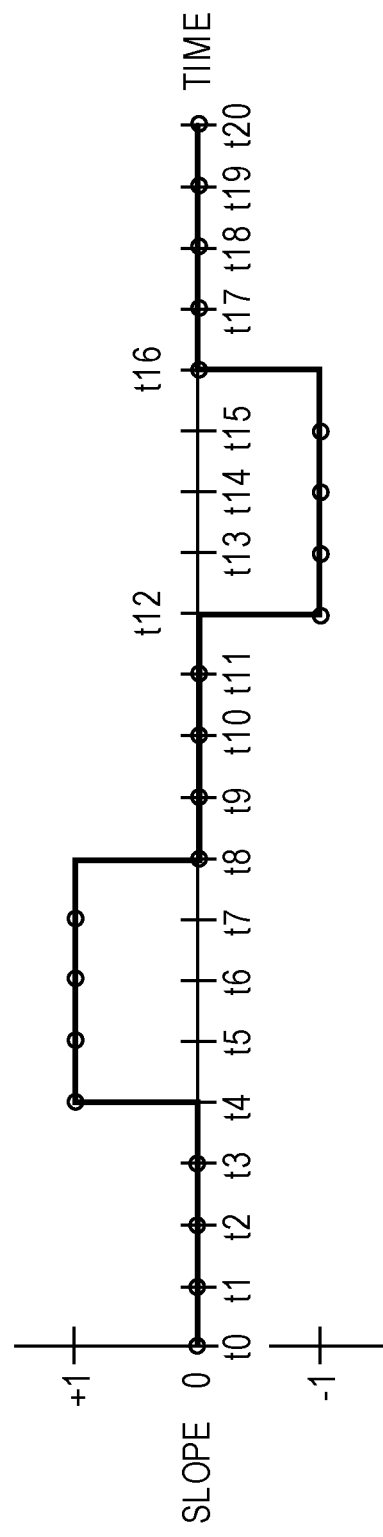
Figure 10:
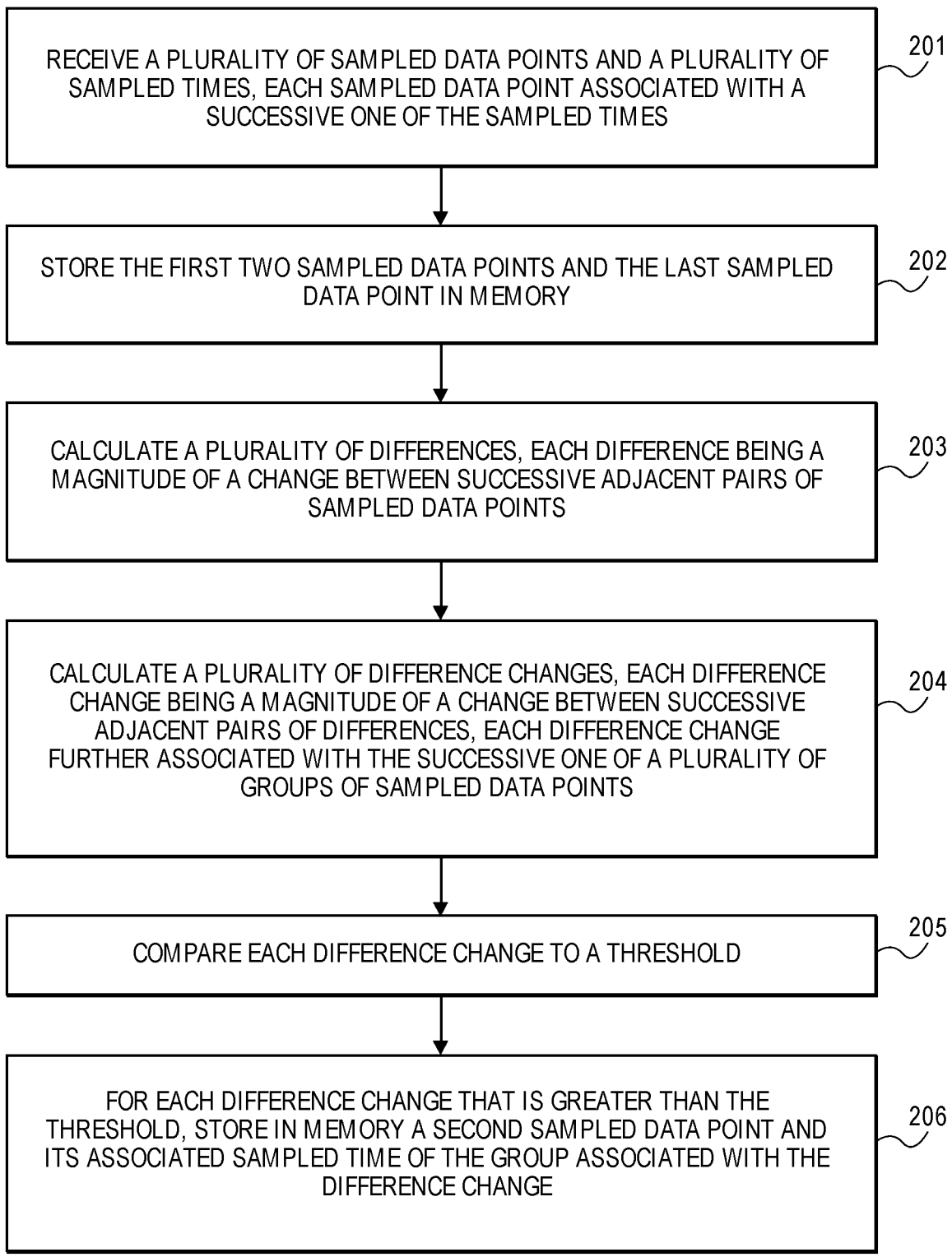
Figure 11A:
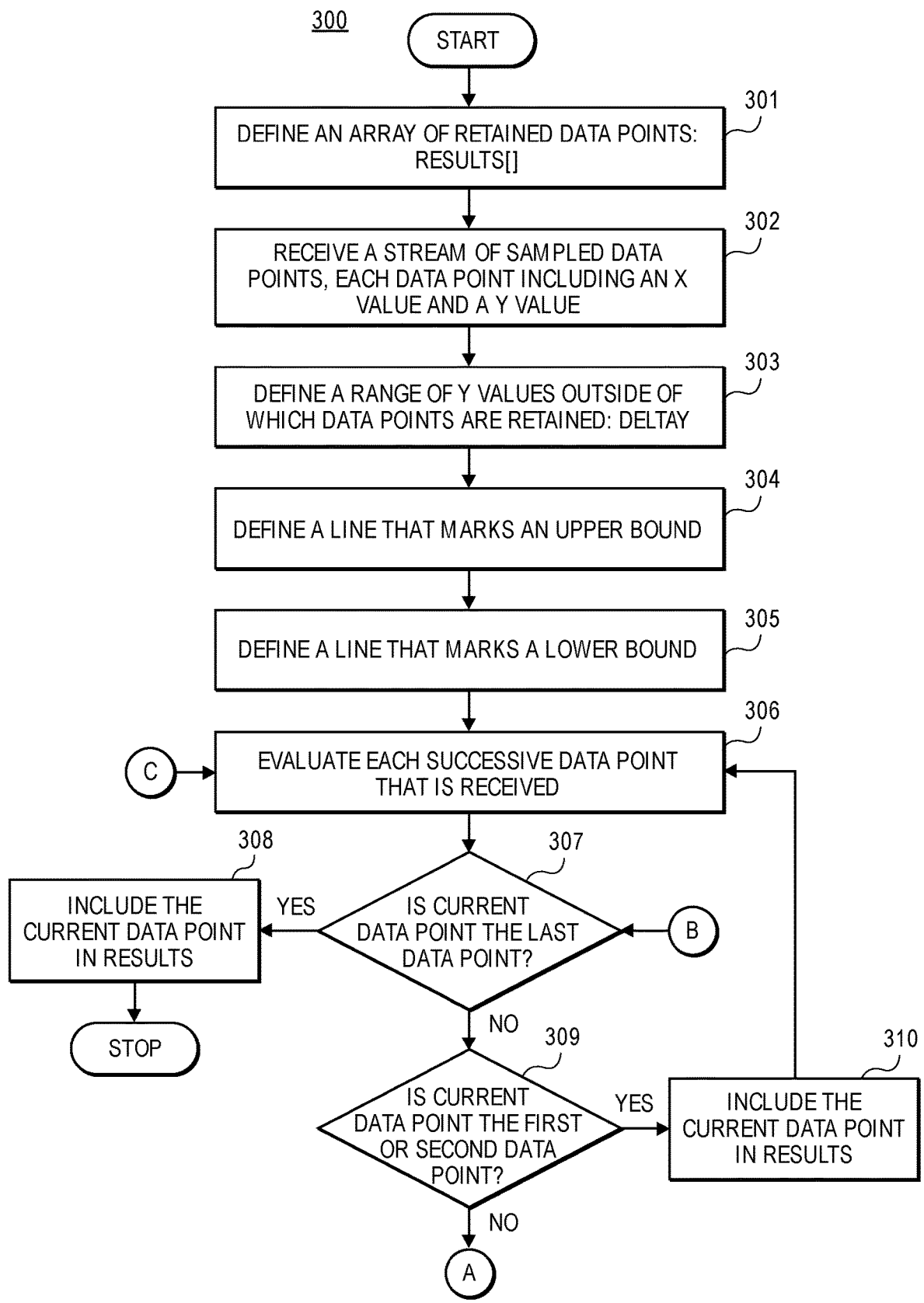
Figure 11B:
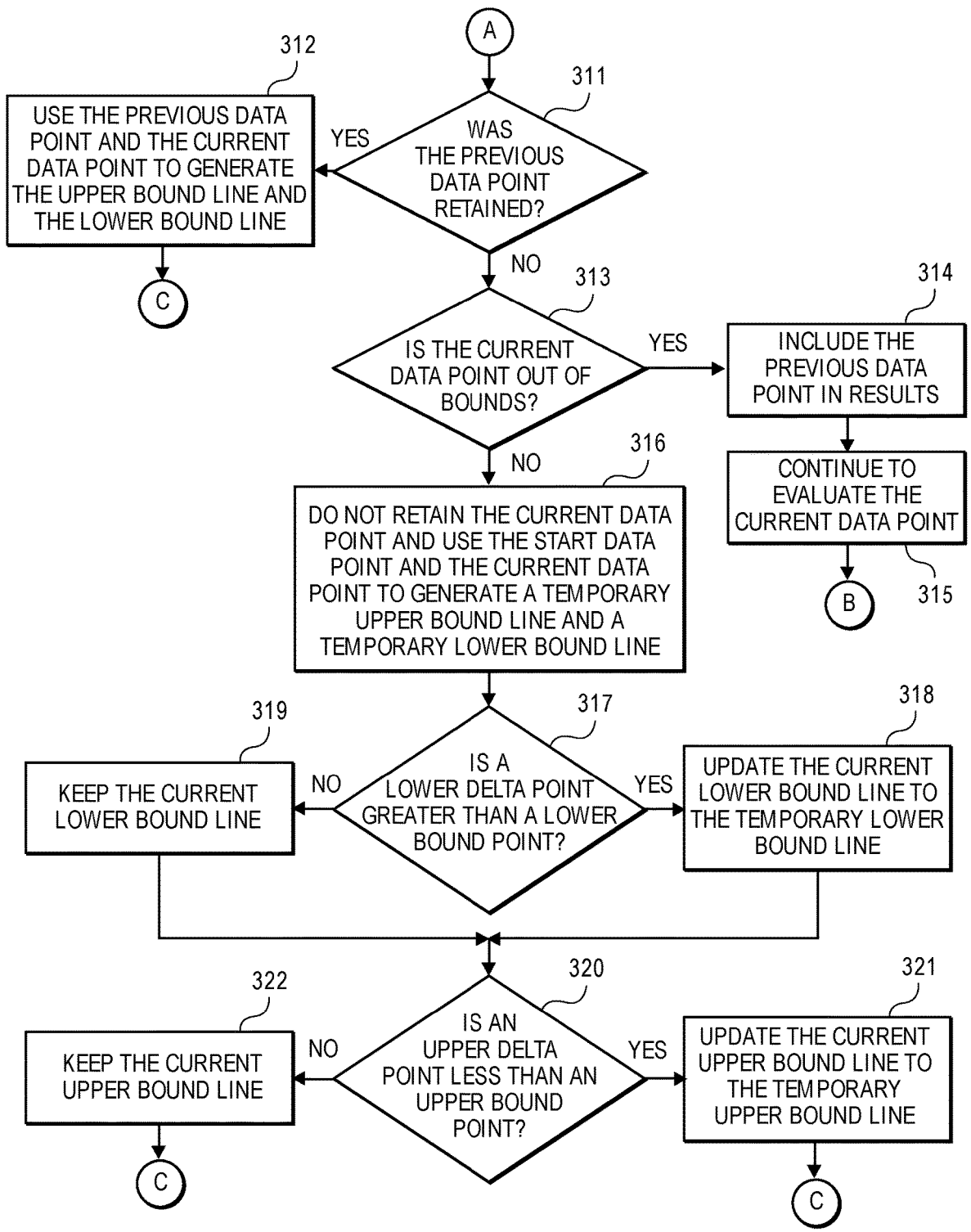
Figure 12:
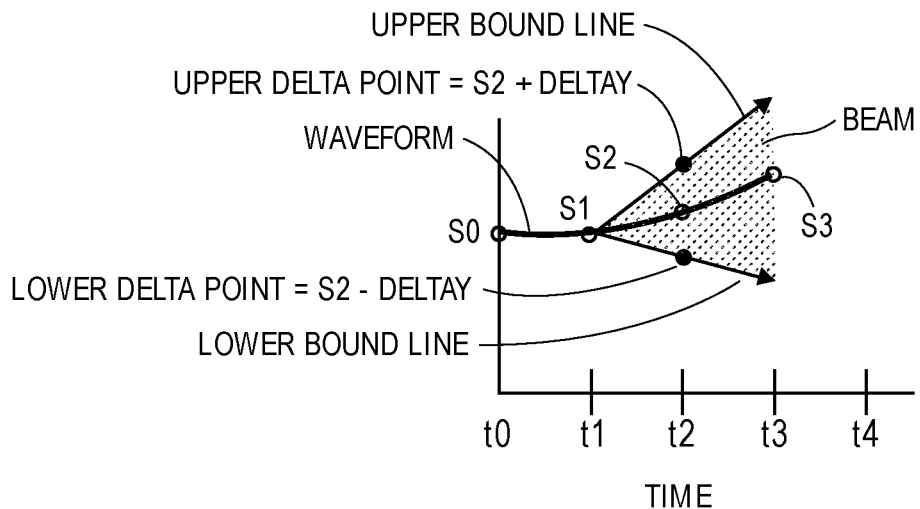
Figure 13:
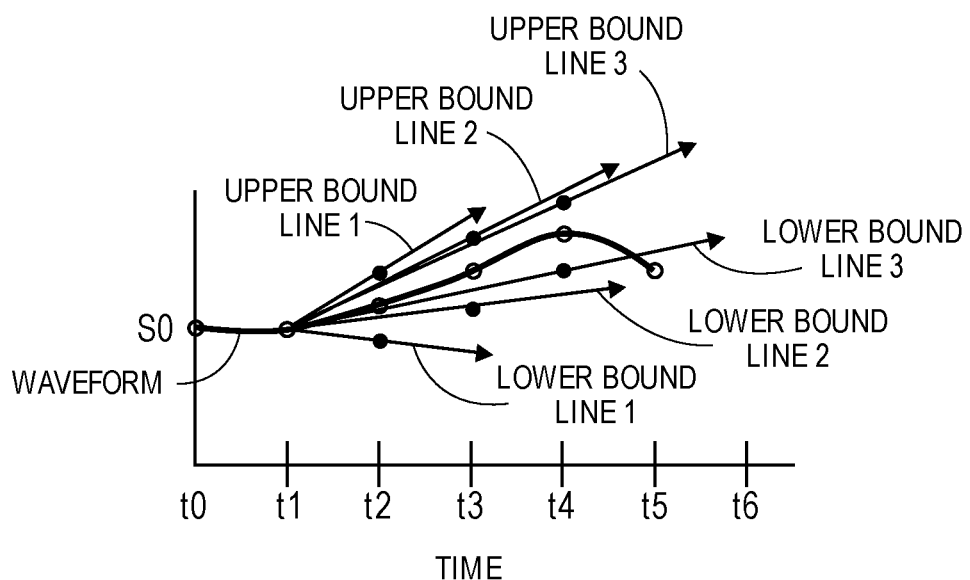
Figure 14:
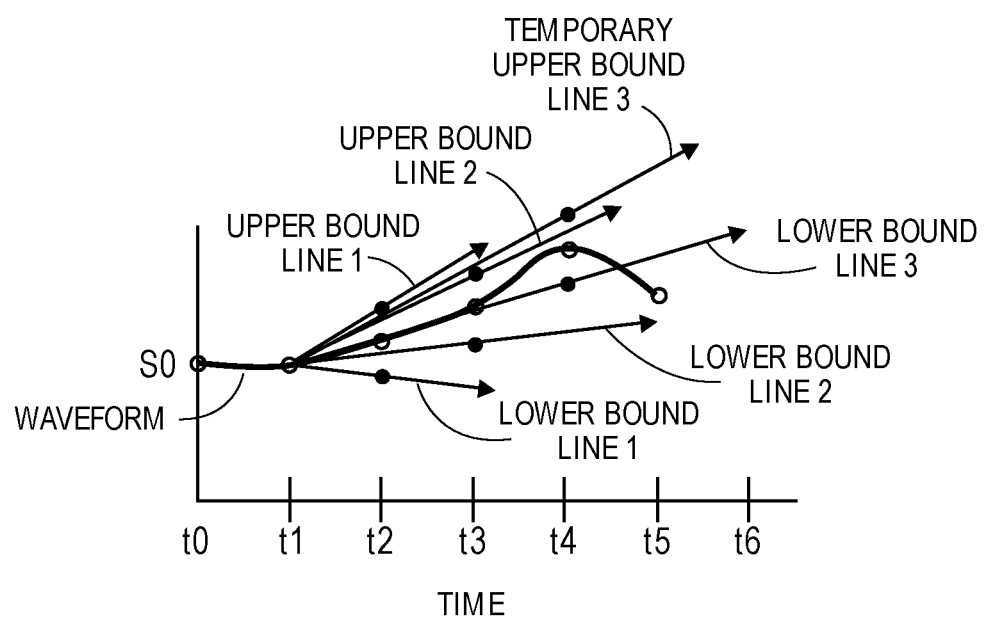
Figure 15:
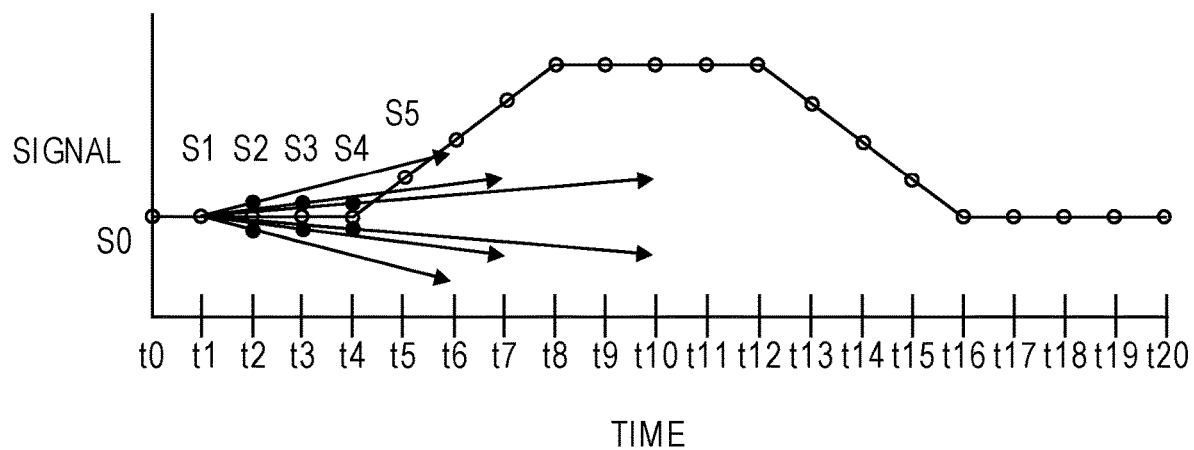
Figure 16:
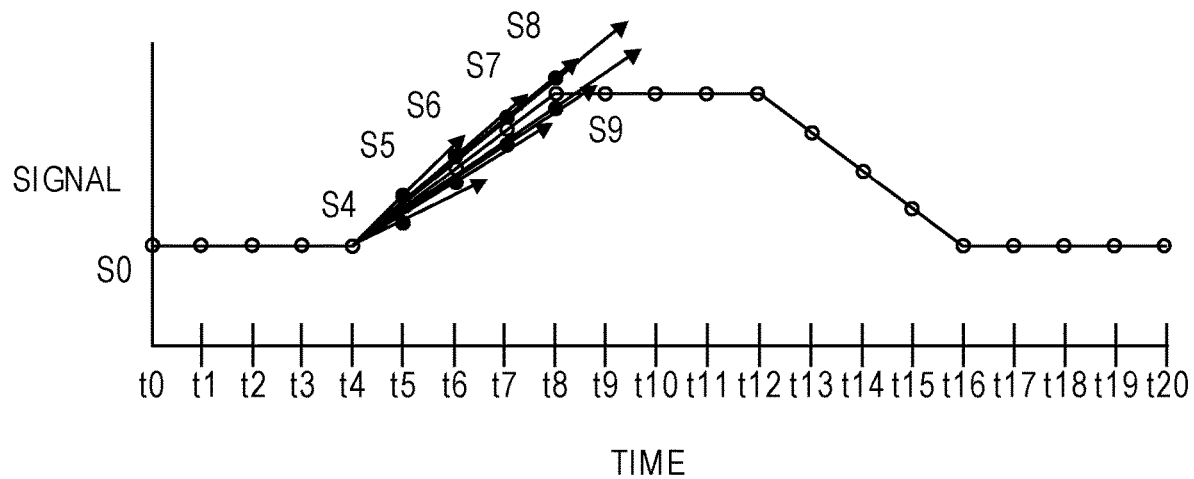
Figure 17:
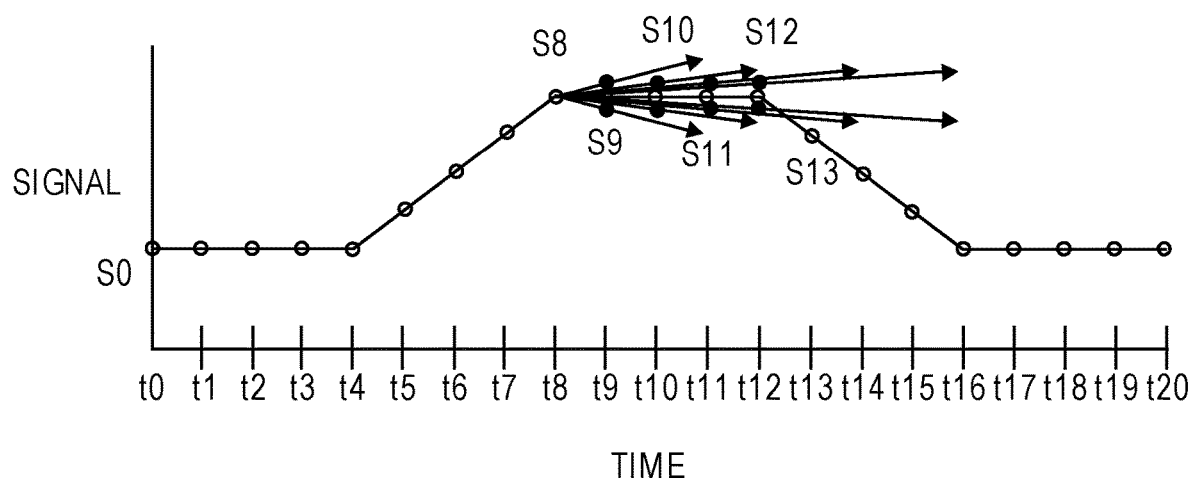
Figure 20A:
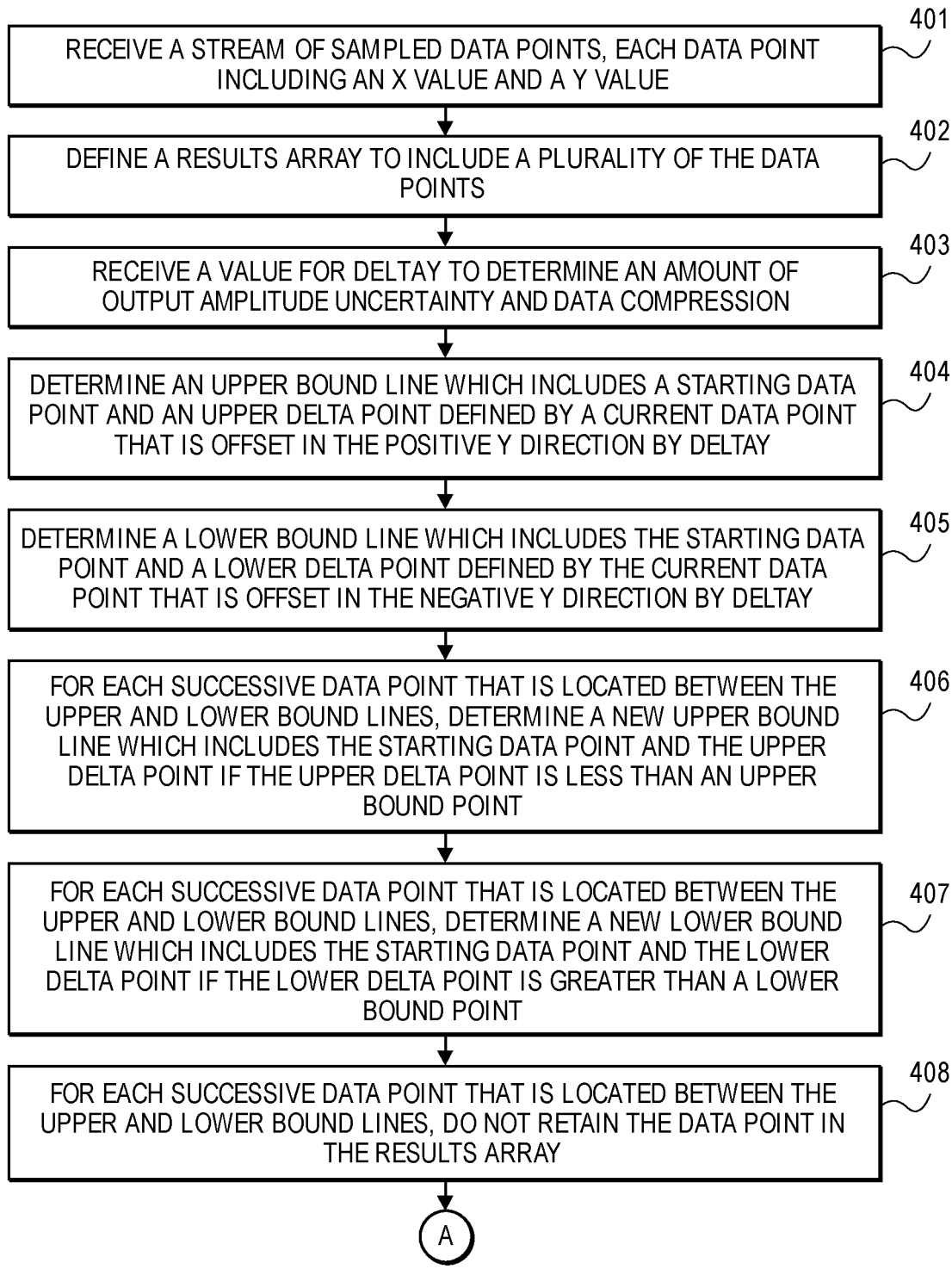
Figure 20B:
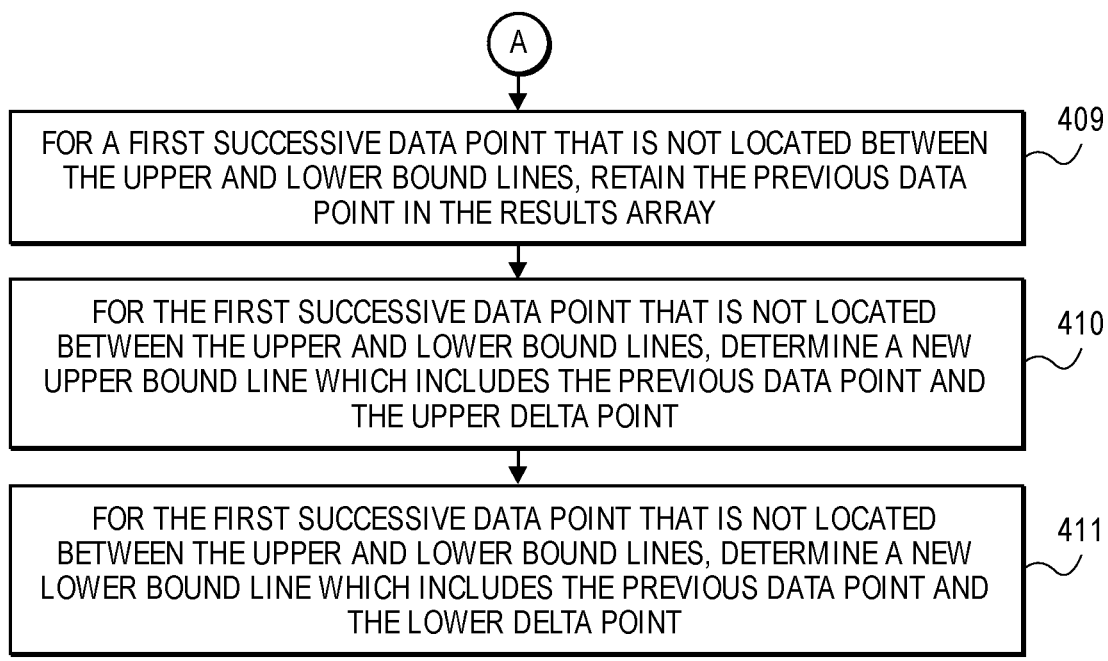
Figure 21:
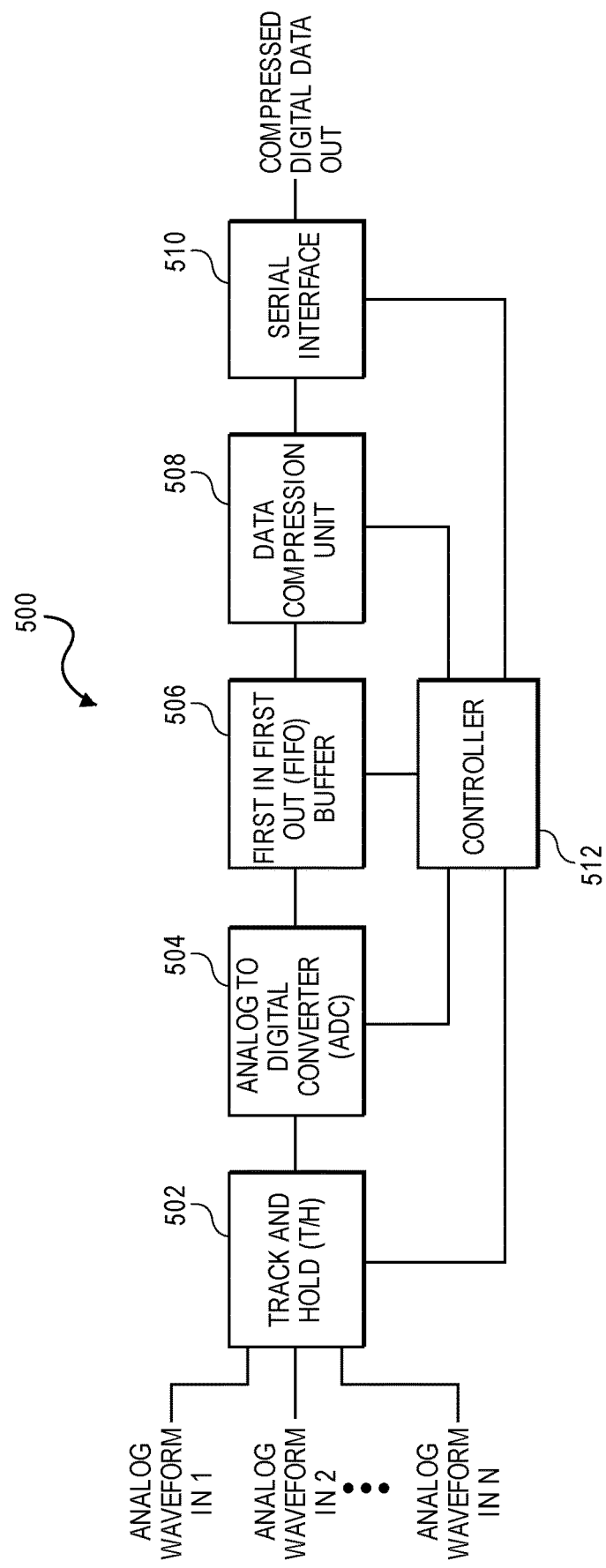
Figure 22:
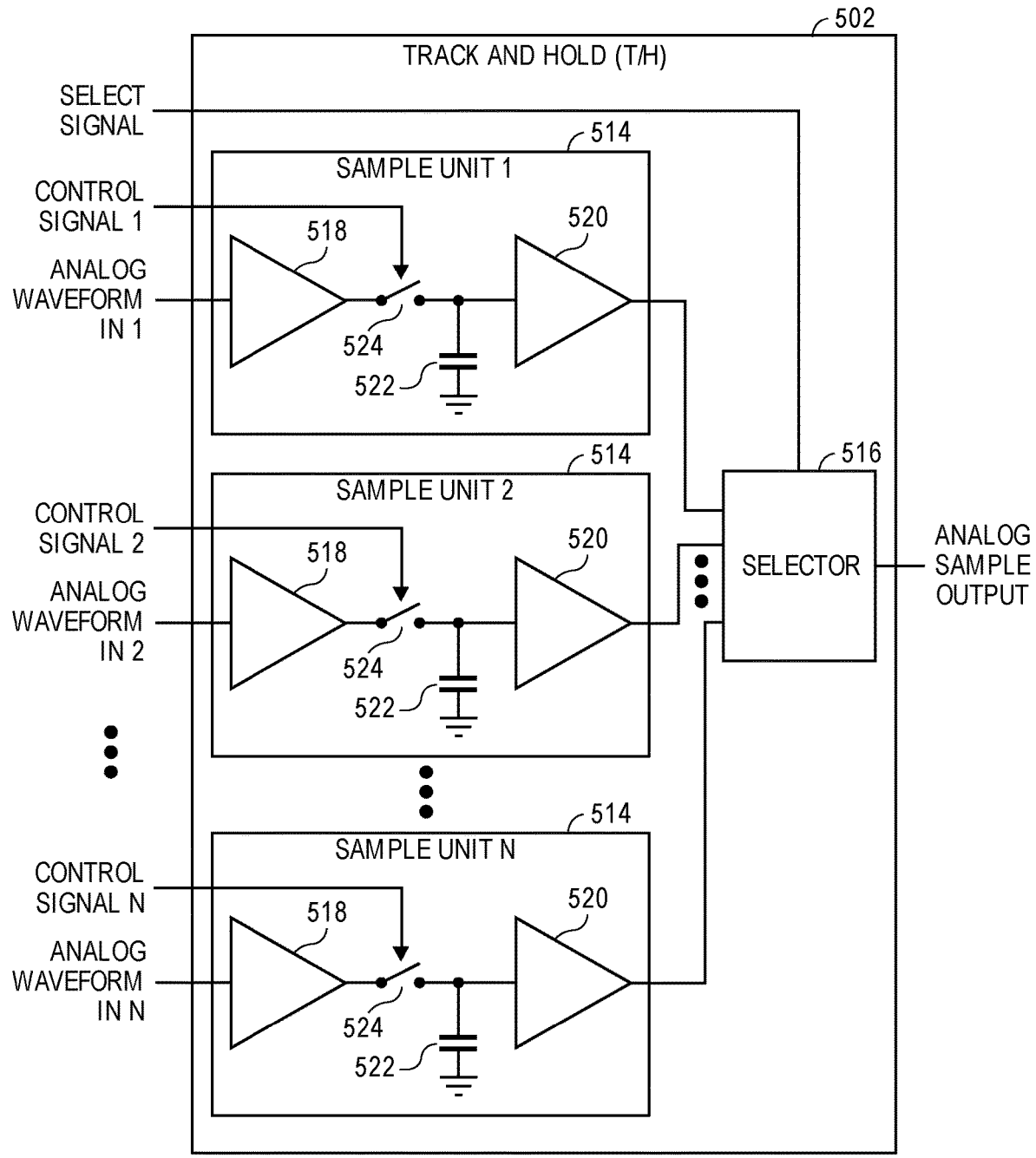
Figure 23:
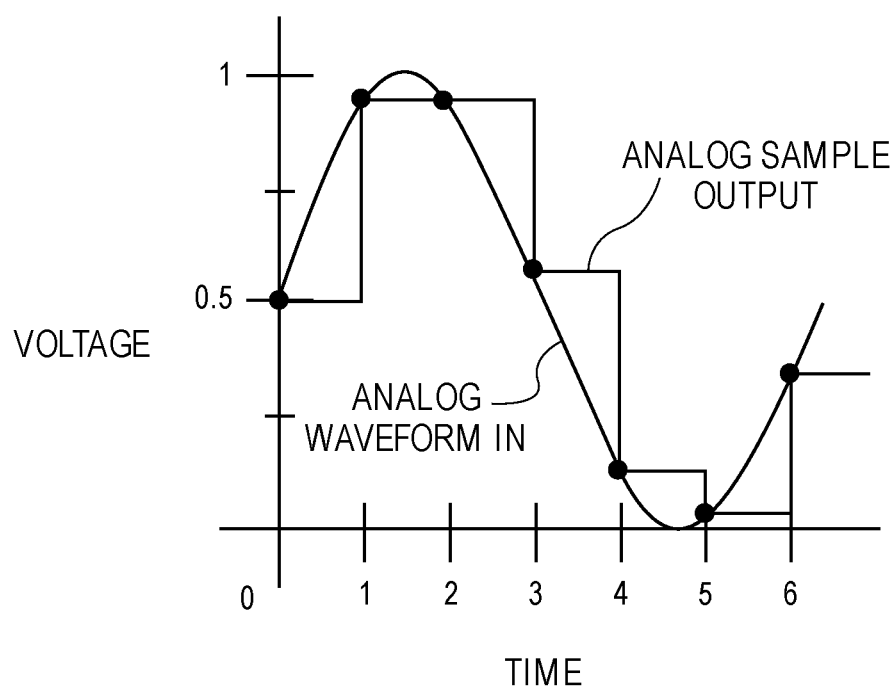
Figure 24:
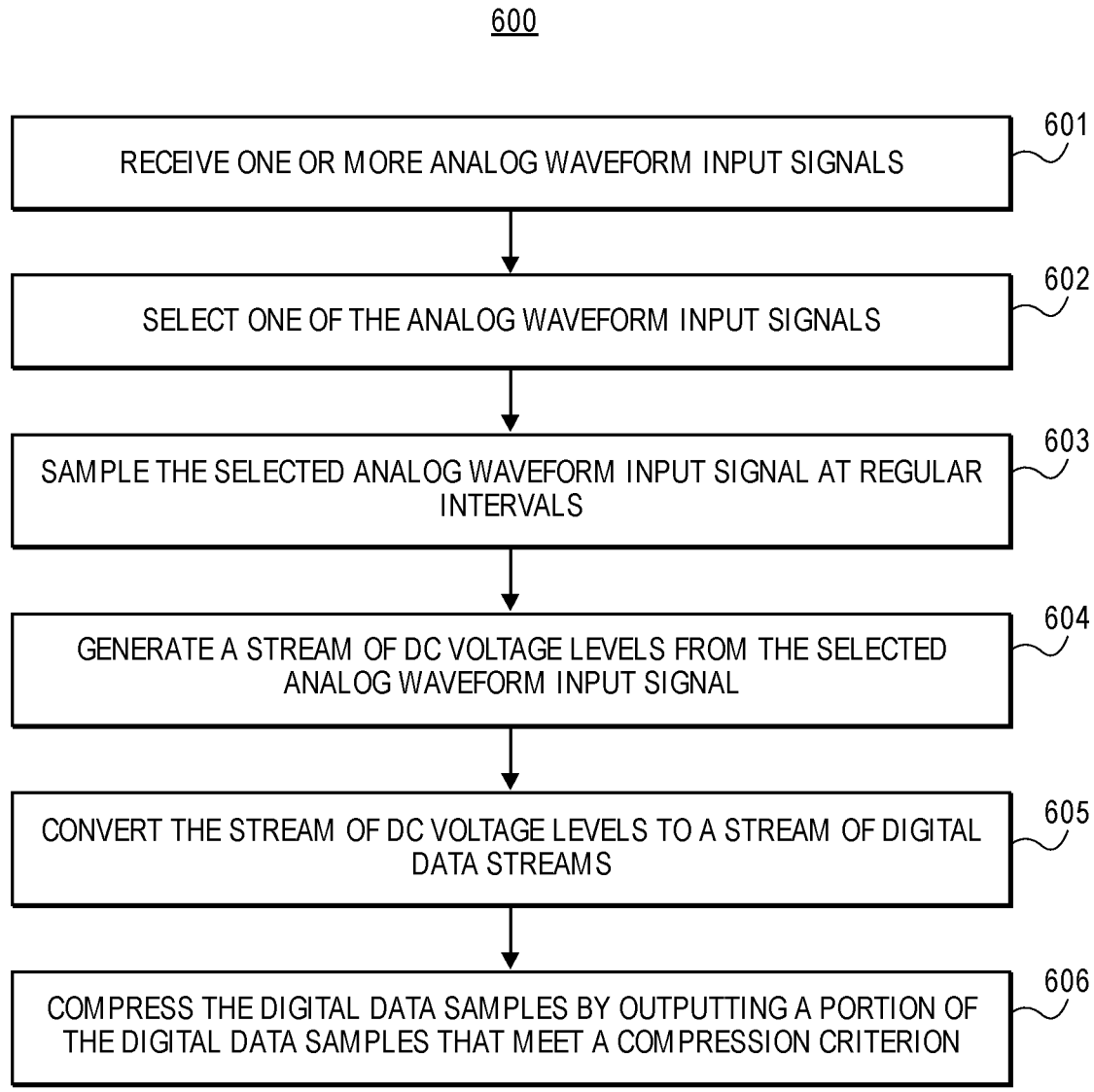
Figure 25:
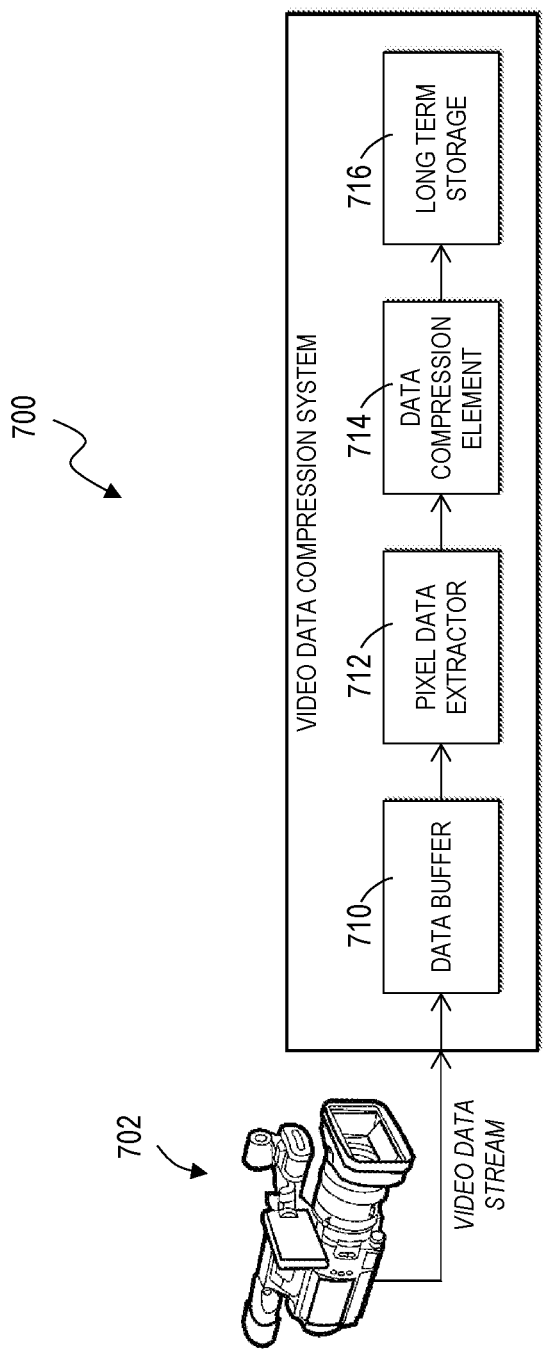
Figures 26, 27, 29:
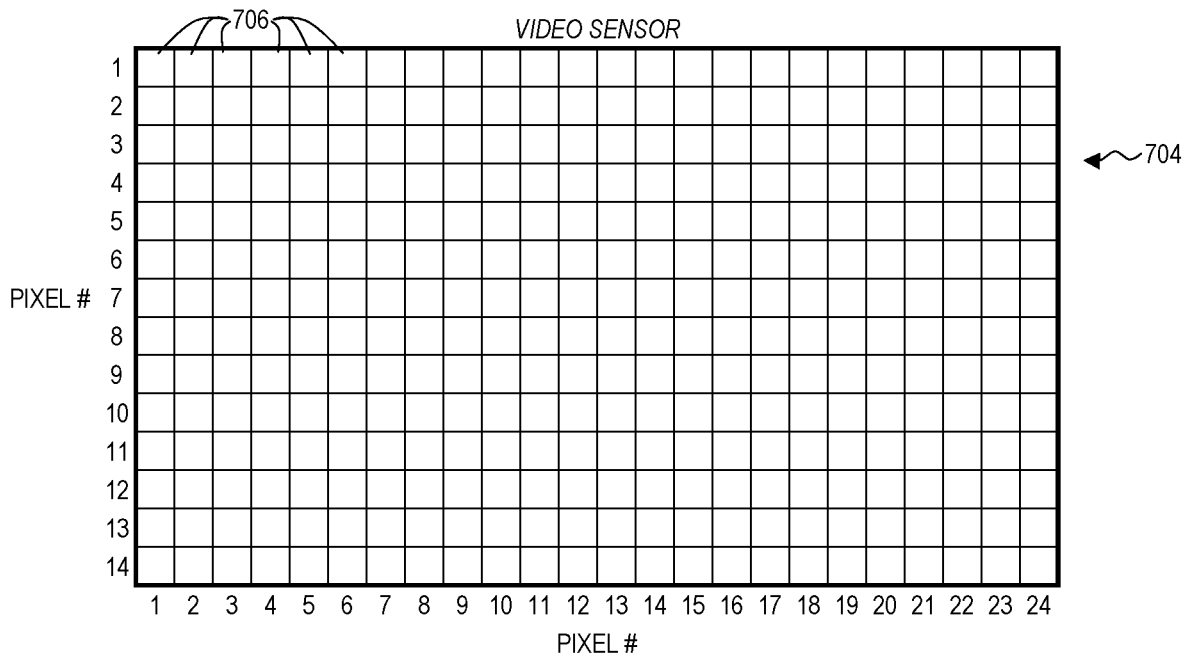
Figure 28:
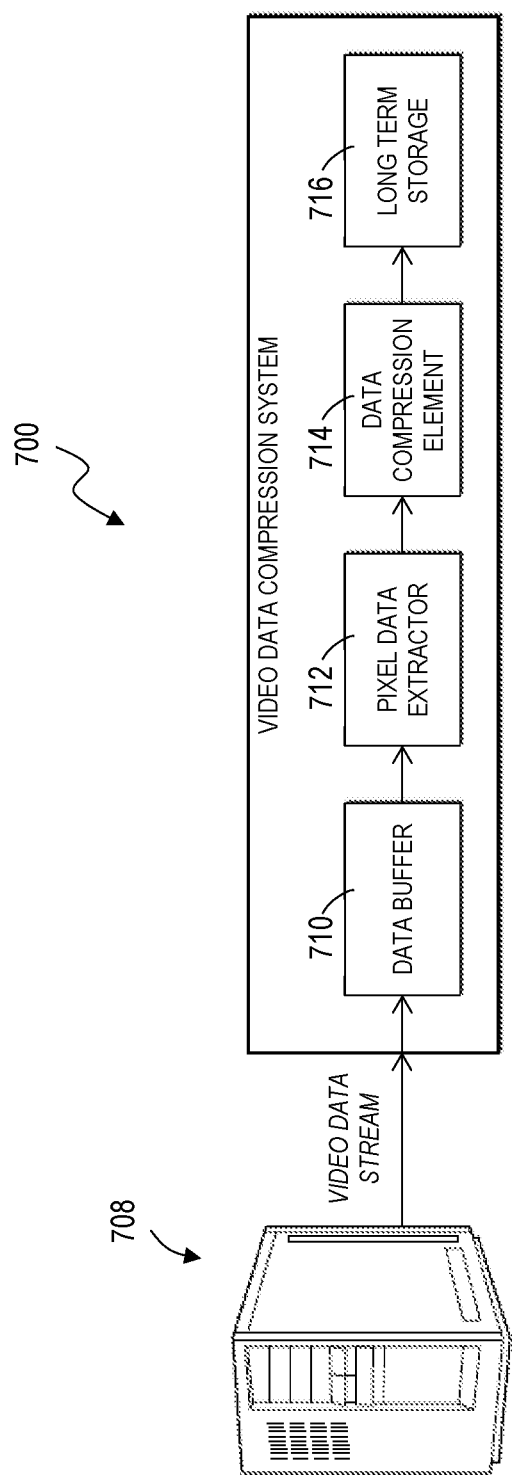
Figure 30A:
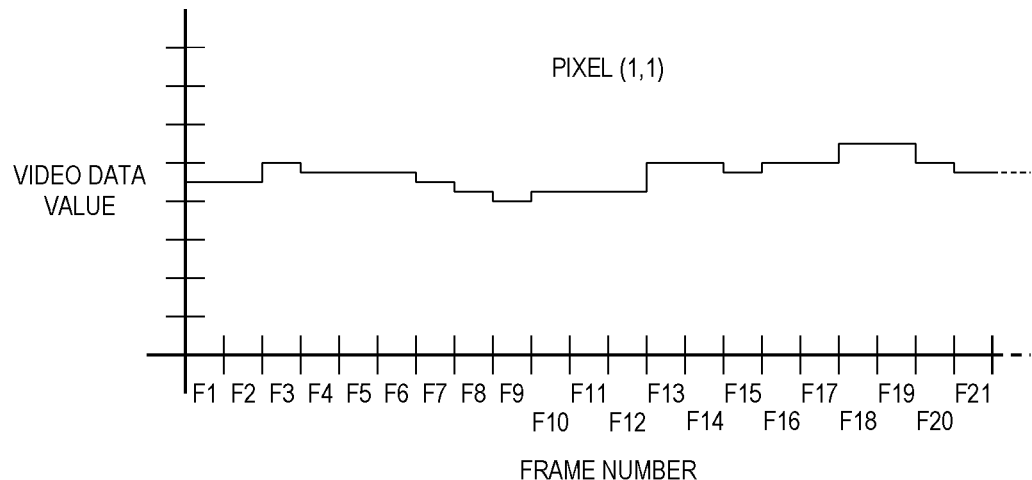
Figure 30B:
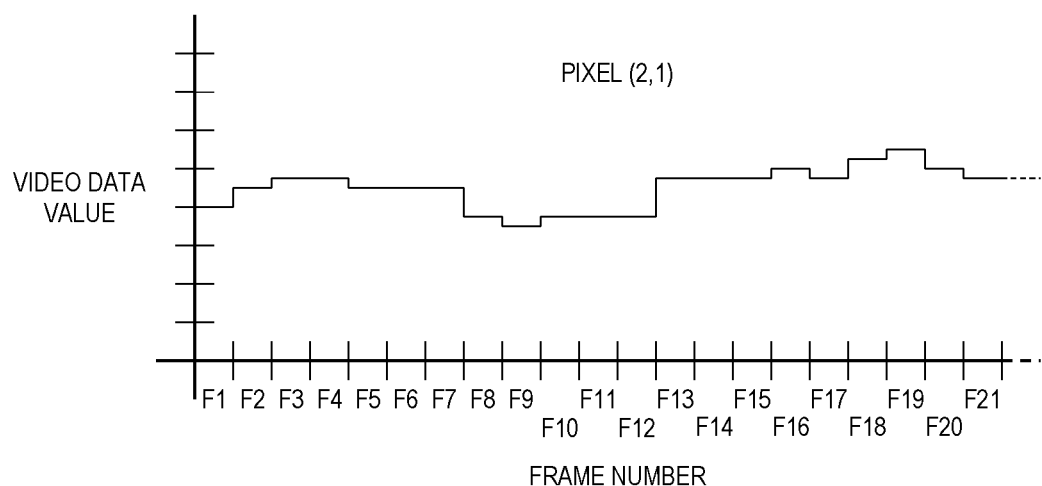
Figure 33:
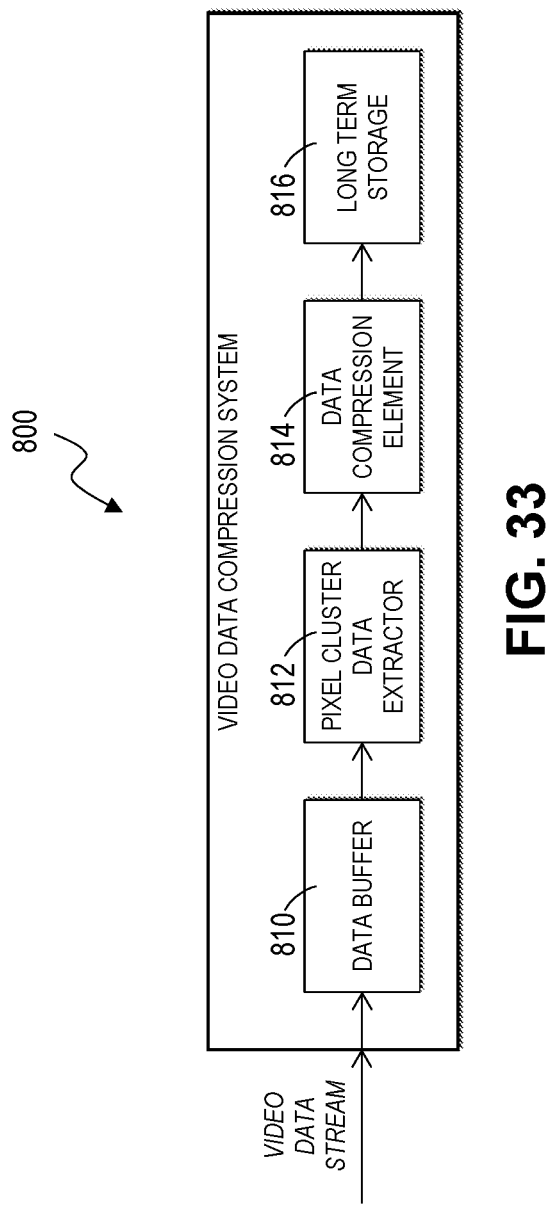
Figure 35:
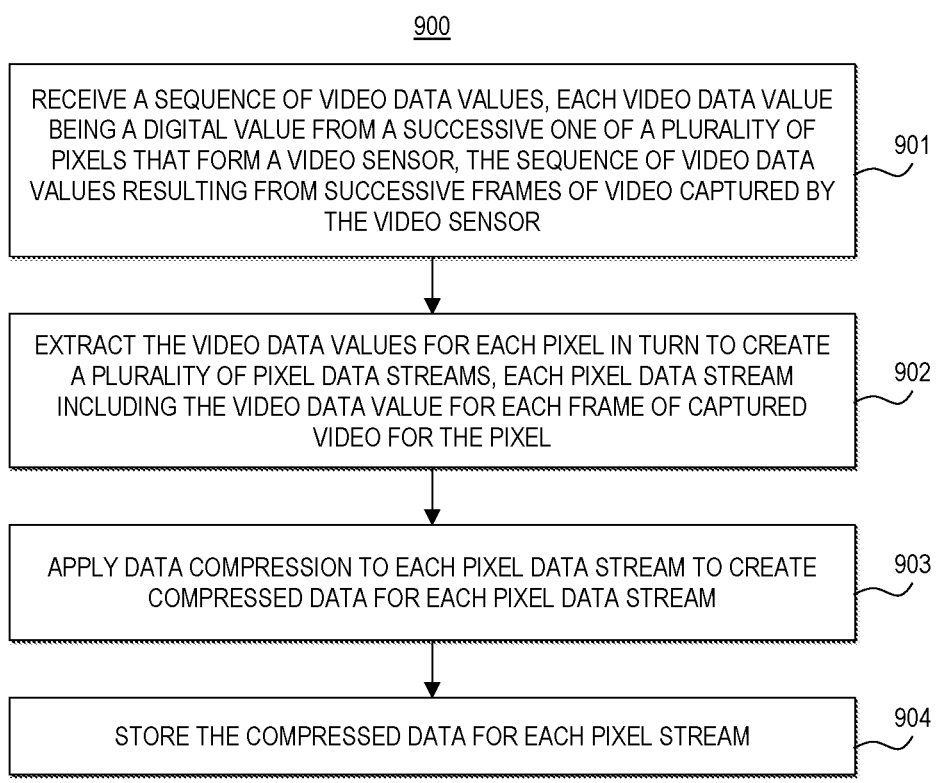
Figure 36:
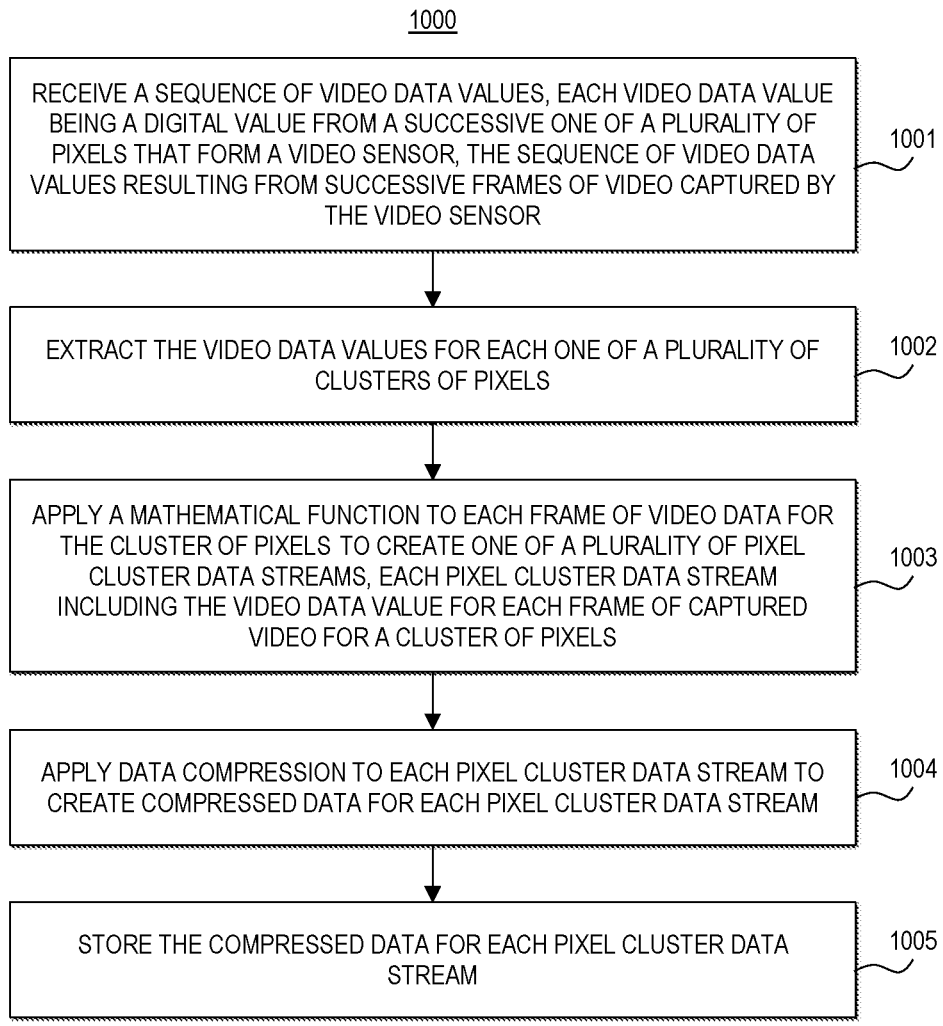

FIGS. 4A, 4B, and 4C depict a flow chart of an algorithm for compressing sampled data;

FIG. 5 is a depiction of an inputamplitude array, configured to store sampled data points, and an inputtime array, configured to store sampled times;

FIG. 6 is a depiction of a difference array, configured to store a plurality of differences, each difference being a magnitude of a change between successive adjacent pairs of sampled data points;

FIG. 7 is a depiction of an outputamplitude array, configured to store compressed data points, and an outputtime array, configured to store compressed times;

FIG. 8 is a plot of the signal vs. time of FIG. 2, depicting only the compressed data points and compressed times;

FIG. 9 is a plot of the slope vs. time for the waveform of FIG. 2;

FIG. 10 is a listing of at least a portion of the steps of a method for compressing sampled data;

FIGS. 11A and 11B is depict a flow chart of a second algorithm for compressing data that has been sampled from an analog waveform;

FIG. 12 is a plot of a first waveform over time illustrating portions of the second algorithm;

FIG. 13 is a plot of a second waveform over time illustrating portions of the second algorithm;

FIG. 14 is a plot of a third waveform over time illustrating portions of the second algorithm;

FIG. 15 is a plot of the signal vs. time for the waveform of FIG. 2 illustrating the application of the second algorithm on a first portion of the waveform;

FIG. 16 is a plot of the signal vs. time for the waveform of FIG. 2 illustrating the application of the second algorithm on a second portion of the waveform;

FIG. 17 is a plot of the signal vs. time for the waveform of FIG. 2 illustrating the application of the second algorithm on a third portion of the waveform;

FIG. 18 is a plot of the signal vs. time for the waveform of FIG. 2 illustrating the application of the second algorithm on a fourth portion of the waveform;

FIG. 19 is a plot of the signal vs. time for the waveform of FIG. 2 illustrating the application of the second algorithm on a fifth portion of the waveform;

FIGS. 20A and 20B include a listing of at least a portion of the steps of a second method for compressing data that has been sampled from an analog waveform;

FIG. 21 is a schematic block diagram of a system for compressing data sampled from an analog waveform signal;

FIG. 22 is a schematic block diagram of a track and hold unit of the system of FIG. 21;

FIG. 23 is a plot of voltage vs. time for an analog waveform input signal;

FIG. 24 is a listing of at least a portion of the steps of a method for compressing data sampled from an analog waveform signal;

FIG. 25 is a schematic block diagram of a video data compression system, constructed in accordance with other embodiments of the current invention, configured to compress digital video data from a video camera;

FIG. 26 is a schematic representation of a video sensor configured to capture video for the video camera, the video sensor comprising a plurality of pixels;

FIG. 27 is a listing of a format of a video data stream output by the video sensor;

FIG. 28 is a schematic block diagram of a video data compression system, constructed in accordance with still other embodiments of the current invention, configured to compress digital video data from a computer server;

FIG. 29 is a listing of a format of pixel data streams after pixel data extraction has occurred;

FIG. 30A is a plot of a digital data value vs. a frame number for a pixel at location (1,1);

FIG. 30B is a plot of the digital data value vs. the frame number for the pixel at location (2,1);

FIG. 31 is a listing of a format of segmented pixel data streams after pixel data extraction has occurred for segmented video data streams;

FIG. 32 is a listing of an example of the compressed data output from a data compression element;

FIG. 33 is a schematic block diagram of another embodiment of the video data compression system configured to compress digital video data from a video camera or a file server;

FIG. 34 is a schematic block diagram of a pixel cluster data extractor including a mathematical and logic function element;

FIG. 35 is a listing of at least a portion of the steps of a method for compressing video data; and FIG. 36 is a listing of at least a portion of the steps of another method for compressing video data.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the current invention. The following detailed description is, therefore, not to be taken in a limiting sense. The scope of the current invention is defined only by the appended claims, along with the full scope of equivalents to which such claims are entitled.

Figure 1:
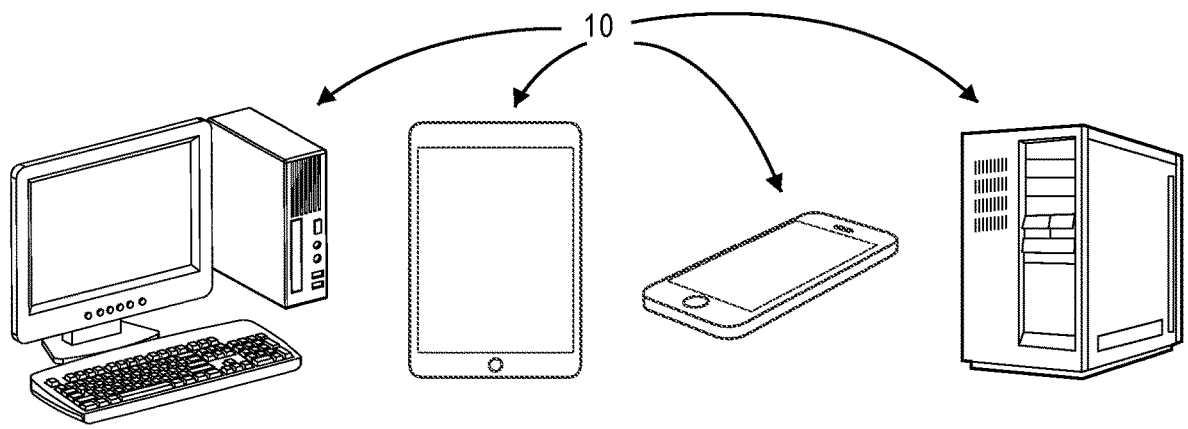
FIG. 1 is a perspective view of a plurality of electronic devices, each constructed in accordance with various embodiments of the current invention, each configured to perform compression of sampled data.

An electronic device 10 for compressing sampled data is shown constructed in accordance with various embodiments of the current invention in FIG. 1. In some instances, the electronic device 10 may be embodied by server computers, workstation computers, desktop computers, or the like which are able to receive a file of sampled data and perform compression thereon. In other instances, the electronic device 10 may be embodied by laptop computers, palmtop computers, notebook computers, tablets or tablet computers, smart phones, mobile phones, cellular phones, personal digital assistants (PDAs), smart watches or wearables, or the like which include components, such as cameras, microphones, sensors, and so forth, that are able to stream sampled data or generate a file of sampled data on which the device 10 can perform compression.

Sampling data may be illustrated in the plot of a signal, or waveform, versus time, as shown in FIG. 2. The signal may be the output of a camera, a microphone, a sensor, or the like and may represent moving or still image data, audio data, motion data, and so forth. Sampling the signal may involve capturing and recording a value of an amplitude of the signal at an instant in time, which creates a sample. The capturing and recording may occur repeatedly, typically at a constant frequency, known as the sampling rate or sampling frequency—thus, generating sampled data. In the example of FIG. 2, the samples, or sampled data points, are shown as a plurality of points, or dots, along the signal and are labeled $S_n$, where n is an index number ranging from 0 to 20. This range is merely exemplary. In practical situations, the range of samples may be orders of magnitude greater. Each sample is taken at a time point, labeled $t_n$, where n is the same index as is used for the samples. The sampled data may form an array with n elements having values $S_0$ to $S_{n-1}$.

Compressing the sampled data, in general, produces an output array of data, compressed data, that includes fewer elements than the array of sampled data. The compressed data (and the compression process) may be lossless, which means that the original signal, from which the sampled data was taken, can be reconstructed perfectly using linear interpolation. Alternatively, the compressed data (and the compression process) may be lossy, which means that the original signal cannot be reconstructed perfectly because some of the sampled data was lost or purposely discarded in an attempt to achieve further compression.

Figure 3:
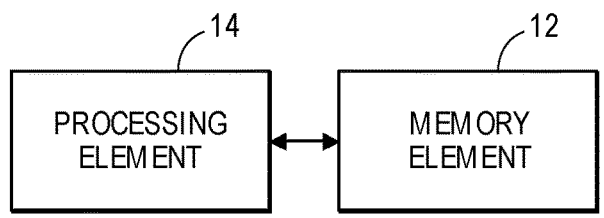
FIG. 3 is a schematic block diagram of various components of one electronic device.

The electronic device 10 may broadly comprise a memory element 12 and a processing element 14, as shown in FIG. 3. The electronic device 10 may further include components such as a display, a user interface including inputs such as a keyboard, a mouse, a touchscreen, or a microphone and outputs such as a speaker, a communication element allowing communication with other devices or systems, cameras, sensors, and the like which will not be discussed in detail.

The memory element 12 may be embodied by devices or components that store data in general, and digital or binary data in particular, and may include exemplary electronic hardware data storage devices or components such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, or the like, or combinations thereof. In some embodiments, the memory element 12 may be embedded in, or packaged in the same package as, the processing element 14. The memory element 12 may include, or may constitute, a non-transitory "computer-readable storage medium". The memory element 12 may store the instructions, code, code statements, code segments, software, firmware, programs, applications, apps, services, daemons, or the like that are executed by the processing element 14. The memory element 12 may also store settings, data, documents, sound files, photographs, movies, images, databases, and the like. In various embodiments, the memory element 12 may receive and store sampled data.

The processing element 14 may include electronic hardware components such as processors, microprocessors (single-core or multi-core), microcontrollers, digital signal processors (DSPs), field-programmable gate arrays (FPGAs), analog and/or digital application-specific integrated circuits (ASICs), or the like, or combinations thereof. The processing element 14 may generally execute, process, or run instructions, code, code segments, code statements, software, firmware, programs, applications, apps, processes, services, daemons, or the like. The processing element 14 may also include hardware components such as finite-state machines, sequential and combinational logic, and other electronic circuits that can perform the functions necessary for the operation of the current invention. The processing element 14 may be in communication with the other electronic components through serial or parallel links that include universal busses, address busses, data busses, control lines, and the like.

The processing element 14 may be configured or programmed to perform the following functions or operations as a result of hardware, software, firmware, or combinations thereof. The processing element 14 may implement an algorithm 100 for compressing sampled data, as shown in the flowchart of FIGS. 4A, 4B, and 4C and explained as follows. Digitized signal data is received, as indicated in block 101. In some cases, the data may include just sampled values without any timing information, such as sampling rate or times, such as timestamps or time of day, when each sampled value was captured. In other cases, the digitized data may include sampled data values and timing data such as sampling rates or sampled data times. The digitized signal data is examined to determine the content of the data, as in decision blocks 102, 103. If the data does not include timing information, then the algorithm 100 cannot be applied, as indicated in block 104. Otherwise, if the data includes the proper information, then the data is separated into an "inputamplitude" array and an "inputtime" array, as indicated in block 105. The inputamplitude array includes values of all of the sampled data points, Sn, wherein each value is a real number representing an actual value of a physical quantity, such as electric voltage or electric current. There is one sampled data point per array element or cell, as shown in FIG. 5. The inputtime array includes all of the sampled times, tn, wherein the sampled time is a time value, such as a time of day timestamp or an offset time period from when the first sample was taken. There is one sampled time per array element or cell, as shown in FIG. 5.

As indicated in block 106, a "difference" array is created to include a change in magnitude between each subsequent pair of cells in the inputamplitude array (which are the sampled data points). The difference array may be notated as Dm or difference[m], wherein m ranges from 0 to the number of sampled data points minus one. As shown in FIG. 6, each cell of the difference array includes an absolute value of a (mathematical subtraction) difference between adjacent inputamplitude array cells. For example, within the first cell of the difference array, D0 or difference[0], is stored: |S1−S0|, which is also: |inputamplitude[1]−inputamplitude[0]|. Since the difference array includes the mathematical difference between adjacent inputamplitude array cells, the difference array will include one fewer cell than the inputamplitude array. In some embodiments, each cell of the difference array, difference[m], may be calculated as the absolute value of the difference between adjacent inputamplitude array cells divided by a difference between adjacent inputtime array cells. For example, the first cell of the difference array may be calculated as |(S1−S0)/(t1−t0)|.

Arrays "outputamplitude" and "outputtime" are created to store the compressed output data values for the amplitude and time, respectively, as indicated in block 107. The compressed output data values for the amplitude and time include the sampled data points and sampled data times, respectively, that are saved according to the rules of the algorithm 100, as discussed in more detail below.

An "allowablechange" variable is also created and assigned a value, as indicated in block 108. The allowablechange variable controls whether the algorithm 100 is lossless or lossy, and how much compression or loss occurs. For example, the data compression of the algorithm 100 is lossless when allowablechange=0. The data compression of the algorithm 100 is lossy when allowablechange>0. Generally, the greater the value of allowablechange, the more lossy the data compression. During implementation of the algorithm 100, the allowablechange variable acts as a constant and maintains its value throughout execution, but it may change value from the compression of one sampled data set to the next. In some embodiments, the user may be able to choose the value of the allowablechange variable in order to control the performance of the algorithm 100. Variables "lastdifference", "localdifference", "inputindex", and "outputindex" are created as indicated in block 109. lastdifference stores a value of the most recent cell from the difference array while the algorithm 100 sequentially retrieves the value of each cell of the difference array, as discussed in more detail below. localdifference stores a difference in magnitude between sequentially retrieved values of cells of the difference array and lastdifference. inputindex is a pointer that points to a current cell of the inputamplitude array. outputindex is pointer that points to a current cell of the outputamplitude array.

The values from the first two cells of the inputamplitude array are stored into the first two cells of the outputamplitude array, as indicated in block 110. This is a default step to store the first two sampled data points. outputindex is initialized to a value of 2 and inputindex is initialized to a value of 1, as indicated in blocks 111, 112. lastdifference is also initialized to have to the first value of the difference array, as indicated in block 113.

localdifference is set to be equal to an absolute value of a difference between the value of the difference array cell pointed to by inputindex and lastdifference, as indicated in block 114. The step of block 114 may mark the beginning of a loop of steps that are performed repeatedly. The number of times that the loop of steps may be performed is equal to the number of cells in the difference array minus 1.

The sampled data points may be considered to form a plurality of segments in sequential order, wherein each segment is a line between successive adjacent pairs of sampled data points. For example, a first segment may be a line between the first and second sampled data points, a second segment may be a line between the second and third sampled data points, and so forth. The slope of each segment may be a difference in its y-values divided by a difference in its x-values. Given that each segment has the same difference in its x-values, the slope then may be considered just the change in its y-values, which is the difference in sampled data points, or what is stored in each cell of the difference array. Since lastdifference stores the value of the most recent difference array cell, the step of block 114 calculates the magnitude of the change in slope from segment to segment, wherein the change is stored in localdifference. For example, the first time the step of block 114 is performed, inputindex=1 and lastdifference=D0. Thus, localdifference=|D1−D0|. In other words, the first time through, localdifference equals the magnitude of the change in slope from the first segment to the second segment.

localdifference is compared to allowablechange to determine if localdifference is greater than allowablechange, as indicated in decision block 115. The step of block 115 determines whether compression is performed, wherein compression is the discarding of the current sampled data point from being stored in the outputamplitude array, which is the compressed data set. The current sampled data point is the second point of the first segment, which is also the first point of the second segment in the comparison. If localdifference (the amount of change in the slope of the last two segments) is less than or equal to allowablechange, then compression is performed and the current sampled data point is not stored in the outputamplitude array. In other words, if the slope of the segments is not changing much at the current sampled data point, then there is no need to save the current sampled data point. And, the flow of the algorithm 100 is from block 115 to block 120.

On the other hand, if localdifference is greater than allowablechange, then compression is not performed and the current sampled data point is stored in the outputamplitude array. In other words, if the slope of the segments is changing significantly at the current sampled data point, then the current sampled data point should be saved. And, the algorithm 100 flows to block 116, in which the current sampled data point, inputamplitude[inputindex], is saved in the compressed data set, outputamplitude[outputindex]. To continue the example above regarding the first time the steps of blocks 115 and 116 are performed, localdifference, which is |D1−D0|, is compared with allowablechange. This comparison involves the sampled data points S0, S1, S2, and determines whether the slope of the segments formed by the points changes significantly at S1. If so, sampled data point S1 is saved. If not, then sampled data point S1 is not saved.

In addition, the current sampled time point, inputtime[inputindex], is saved in the compressed time set, outputtime[outputindex], as indicated in block 117. Furthermore, lastdifference is updated with the current value from the difference array, difference[inputindex], as indicated in block 118. outputindex is incremented, as indicated in block 119, since a sampled data point was saved in the compressed data set.

inputindex is incremented, as indicated in block 120. This step is performed either after the step of block 119 or after the step of block 115 if localdifference is not greater than allowablechange. Thus, inputindex is incremented whether or not compression was performed on the current sampled data point.

inputindex is checked to determine if it is equal to the number of difference array elements, as indicated in decision block 121. If not, then the loop of steps from blocks 114-120 continues, and the flow of the algorithm 100 returns to the step of block 114. If so, then the loop of steps from blocks 114-120 is complete, and the flow proceeds to the step of decision block 122, wherein the last element of the outputtime array is checked to determine if it is equal to the last element of the inputtime array. If so, then the algorithm 100 is complete. If not, then the last sampled data point, inputamplitude[last element], is stored in the compressed data set, outputamplitude[last element], as indicated in block 123. And, the last sampled time point, inputtime[last element], is stored in the compressed time set, outputtime[last element], as indicated in block 124. After the step of block 124, the algorithm 100 is complete.

As an example of its operation, the algorithm 100 was applied to a sampled data set created by sampling the signal shown in FIG. 2. The compressed data set and the compressed time set, which are the outputamplitude array and the outputtime array, respectively, are shown in FIG. 7. And, the compressed data points plotted on the original signal are shown in FIG. 8. As can be seen in FIG. 8, the first two sampled data points, S0, S1, were saved, as indicated in the step of block 110. The other sampled data points, S4, S8, S12, and S16, that were saved as compressed data were the data points at which the slope of the segments changed significantly, i.e., the slope change was greater than allowablechange. Finally, the last sampled data point was saved as compressed data, as indicated in the step of blocks 123, 124.

The processing element 14 may also be configured or programmed to perform the following functions or operations. The processing element 14 receives a plurality of sampled data points, e.g., S0-Sn−1, and a plurality of sampled times, e.g., t0-tn−1. Each sampled time is associated with a successive sampled data point. The processing element 14 calculates a slope, which may also be considered a first derivative, for each of the sampled data points in succession, wherein the slope is a value of change between the sampled data point and its successive sampled data point. For example, a slope for the first sampled data point, S0, is calculated as the second sampled data point, S1, minus the first sampled data point, S0: (S1-S0), i.e., for sampled data points that were sampled at a constant sampling frequency. A plot of the slope of the exemplary waveform of FIG. 2 versus time is shown in FIG. 9. In general, or for sampled data points that were sampled with a variable sampling frequency, a slope for the first sampled data point, S0, is calculated as a difference between a value of the successive sampled data point, S1, and a value of a current sampled data point, S0, divided by a difference between a value of the sampled time, t1, associated with the successive sampled data point, S1, and a value of the sampled time, t0, associated with the current sampled data point, S0: (S1−S0)/(t1−t0). The processing element 14 tracks, or stores, at least temporarily, the currently-calculated slope and the previously-calculated slope. For example, when calculating the slope for the second (current) sampled data point, S1, the processing element 14 also has stored and has access to the slope calculated for the first (previous) sampled data point, S0. The processing element 14 may also calculate a change in the slope as a current slope minus a previous slope, or a difference between the two slopes. When the slope changes from the previous-sampled data point to the current-sampled data point—meaning that the difference between the two slopes is not zero—the processing element 14 stores the current-sampled data point in the memory element 12. The processing element 14 may also store the sampled time associated with the current-sampled data point.

The processing element 14 continues the process of calculating a slope for each sampled data point and calculating a difference between the current slope and the previous slope. When the difference is not zero, the processing element 14 stores the current-sampled data point. In other words, wherever the slope changes value, the data point at which the change occurs is stored. From the plot of the slope in FIG. 9, it is seen that the slope changes value at the data points at the following times: t4, t8, t12, and t16. So, the data points at those times are stored in the memory element 12. When the processing element 14 comes to the last sampled data point, it does not perform the calculations, but instead simply stores the last sampled data point and its sampled time. In various embodiments, the processing element 14 may store the first two sampled data points and their associated sampled times automatically.

FIG. 10 depicts a listing of at least a portion of the steps of an exemplary computer-implemented method 200 for compressing sampled data. The steps may be performed in the order shown in FIG. 10, or they may be performed in a different order. Furthermore, some steps may be performed concurrently as opposed to sequentially. In addition, some steps may be optional or may not be performed. The steps may be performed by the processing element 14 of the electronic device 10 via hardware, software, firmware, or combinations thereof. Furthermore, the steps may be implemented as instructions, code, code segments, code statements, a program, an application, an app, a process, a service, a daemon, or the like, and may be stored on a computer-readable storage medium, such as the memory element 12.

Referring to step 201, a plurality of sampled data points and a plurality of sampled times are received. Each sampled data point may be the result of capturing and recording a value of an amplitude of a signal at an instant in time, which is the associated sampled time. Exemplary sampled data points are shown in FIG. 2 and are labeled as S0-S20. Also shown are sampled data times, labeled as t0-t20, wherein t0 is associated with S0, t1 is associated with S1, and so forth. Typically, the sampled data point is a real number representing an actual value of a physical quantity, such as electric voltage or electric current. The sampled time may include a time stamp, such as time of day, an offset time period from when the first sampled data point was captured, or the like Referring to step 202, the first two sampled data points, S0, S1, and the last sampled data point, Sn−1, are stored in the memory element 12. The first two sampled data points and the last sampled data point may be ignored by the operations of the subsequent steps, and thus, may be stored by default. The first two and last sampled times are stored in the memory element 12 as well.

Referring to step 203, a plurality of differences is calculated, wherein each difference is a magnitude of a change between successive adjacent, or consecutive, pairs of sampled data points. Each difference, notated as Dm, wherein m ranges from 0 to the number of sampled data points minus one, may be calculated by subtracting one sampled data point from another sampled data point and determining an absolute value of the result. For example, a first difference, D0, may be calculated as: |S1−S0|. A second difference, D1, may be calculated as: |S2−S1|, and so forth.

Referring to step 204, a plurality of difference changes is calculated, wherein each difference change a magnitude of a change between successive adjacent, or consecutive, pairs of differences. Each difference change, notated as DCx, wherein x ranges from 0 to the number of differences minus one, may be calculated by subtracting one difference from another difference and determining an absolute value of the result. For example, a first difference change, DC0, may be calculated as: |D1−D0|. A second difference change, DC1, may be calculated as: |D2−D1|, and so forth. In addition, each difference change is associated with successive groups of sampled data points, with each group including three sampled data points. The three sampled data points are three consecutive sampled data points that are used to determine two consecutive differences. For example, the first difference, D0, is determined from S1 and S0, while the second difference, D1, is determined from S2 and S1. Thus, the three consecutive data points are S0, S1, and S2. Since the first difference change, DC0, is determined from D1 and D0, the first difference change is associated with the group of sampled data points comprising S0, S1, and S2. Following the same reasoning, the second difference change, DC1, is associated with the group of sampled data points comprising S1, S2, and S3, and so forth.

The group of three consecutive sampled data points associated with each difference change is also the three points that form the first and second segments of the setup and comparison of blocks 114 and 115 of the algorithm 100 discussed above. Furthermore, the difference change is the same value and calculated in a similar way as the magnitude of the change of slope from the first segment to the second segment.

Referring to step 205, each difference change is compared to a threshold. The threshold controls whether the compression of the sampled data is lossless or lossy, and how much compression or loss occurs. For example, the data compression is lossless when the threshold=0. The data compression is lossy when the threshold>0. Generally, the greater the value of the threshold, the more lossy the data compression.

Referring to step 206, for each difference change that is greater than the threshold, a second sampled data point of the group associated with the difference change is stored in the memory element 12. The sampled time associated with the sampled data point is also stored in the memory element 12. As discussed above for step 204, the group of sampled data points associated with each difference change includes three consecutive sampled data points. The second sampled data point is the middle of the three, or the second ordinal point. For example, the first difference change, DC0, includes sampled data points S0, S1, and S2. The second sampled data point is S1. The second difference change, DC1, includes sampled data points comprising S1, S2, and S3. The second sampled data point is S2, and so forth.

The second sampled data point is also the current sampled data point discussed above with reference to blocks 115 and 116 of the algorithm 100, wherein the determination is made as to whether the change in slope between the first and second segments (localdifference) is greater than the threshold (allowablechange). If so, then the current sampled data point is saved. If not, then the current sampled data point is discarded. Like the current sampled data point of the algorithm 100, the second sampled data point of the method 200 is the point under consideration when the determination is made as to whether data compression is performed and the point is discarded or data compression is not performed and the data point is saved. Thus, all of the second sampled data points that are stored in the memory element 12 form the compressed data set.

Another embodiment of the current invention provides an algorithm 300, as shown in the flowchart in FIGS. 11A and 11B, for compressing data that has been sampled from an analog waveform, also known as the "signal". The algorithm 300 may be performed by the processing element 14 of the electronic device 10 via hardware, software, firmware, or combinations thereof. Furthermore, the algorithm 300 may be implemented as instructions, code, code segments, code statements, a program, an application, an app, a process, a service, a daemon, or the like, and may be stored on a computer-readable storage medium, such as the memory element 12.

Referring to FIG. 12, the algorithm 300 may implement a "narrowing beam" method of data compression in which a virtual beam that originates from a starting data point is established. The beam includes a triangular area that exists between an upper bound line and an intersecting lower bound line. The upper bound line is defined by one of the data points selected to be the starting data point, for example, S1 in FIG. 12, and an upper bound point, which is above the next data point, S2 in FIG. 12. The upper bound point has an x value which is the same as the x value of the next data point and a y value which is the y value of the next data point plus an offset, defined as "deltay". The lower bound line is defined by the starting data point and a lower bound point, which is below the next data point. The lower bound point has an x value which is the same as the x value of the next data point and a y value which is the y value of the next data point minus deltay. The upper bound line and the lower bound line form first and second sides of the triangular area of the virtual beam. The offset, deltay, is typically selected by the user and determines an output amplitude uncertainty, which is an allowable loss of data resolution, that, in turn, determines an amount of compression (i.e., a compression threshold) of the data, or lossiness of the compression. Generally, the larger the value of deltay, the larger the beam and greater the compression—as a result of more data points being in the beam and getting discarded. Larger values of deltay result in more lossy compression. The smaller the value of deltay, the smaller the beam and the less the compression—as a result of fewer data points being in the beam and getting discarded. Smaller values of deltay result in less lossy compression. A value of zero for deltay results in lossless compression.

Successive data points are evaluated to determine whether they are located within the beam. If a data point is located within the beam, then the data point is discarded and the upper bound line is redefined to include the starting point, as mentioned above, and a new upper delta point, which is the current data point plus deltay. The lower bound line is redefined to include the starting point and a new lower delta point, which is the current data point minus deltay. The upper and lower bound lines are redefined, assuming that the possible new lines actually narrow the beam, as discussed in greater detail below. The redefining (redrawing) of the upper and lower bound lines effectively narrows the beam. For each successive data point that lies within the beam, the beam is successively narrowed and those data points are discarded, as shown in FIG. 13 with upper bound line 1 and lower bound line 1 forming the first beam, upper bound line 2 and lower bound line 2 forming the second beam, and upper bound line 3 and lower bound line 3 forming the third beam (although the beams are not shown). The data points at t2, t3, and t4 are discarded. When a successive data point lies outside the beam, such as the data point at t5, then the previous data point, t4, is retained, and the beam is repositioned to originate at the previous data point and include the upper bound line and the lower bound line. These steps continue with the beam being narrowed for each successive data point that lies within the beam, and the beam being repositioned every time a data point lies outside the beam. Generally, those data points inside the beam are discarded, while those data points outside the beam are retained.

The algorithm 300 is described in more detail as follows. Referring to block 301, an array of retained data point named "results" is defined. In order to compress the data sampled from the waveform, the algorithm 300 only keeps those data points which meet a certain criteria. The remaining data points are discarded. The results array stores the data points which are retained.

Referring to block 302, a stream of sampled data points is received. Each data point includes an x value, which has a time, such as a sample time (t0, t1, t2, etc., as shown in the figures) associated with it, and a y value. Alternatively, the sampled data points may just include the y values, with it being understand that the data points were sampled at a fixed periodic rate. A time value for each point could then be calculated given the properties "delta-T", a period of time between each data point (which is the inverse of the sample rate), and "offset-T", the absolute time for the first data point. Thus, the calculation of the time value for a given point would be t=index*delta-T+offset-T, where index is the sequential number of the sample point.

Referring to block 303, "deltay" is defined as a range of y values outside of which data points may be retained, while inside of which data points may be discarded. deltay is used to define the beam shown in FIG. 12. deltay is typically chosen by the user and has a real number value greater than or equal to 0. Generally, the larger the value of deltay, the larger the beam and greater the compression—as a result of more data points being in the beam and getting discarded. Larger values of deltay result in more lossy compression. The smaller the value of deltay, the smaller the beam and the less the compression—as a result of fewer data points being in the beam and getting discarded. Smaller values of deltay result in less lossy compression. A value of zero for deltay results in lossless compression.

Referring to block 304, a line that marks an upper bound of the beam is defined. The line is defined by two points that are known. The first point is one of the data points. The second point is an upper delta point that has an x value which is the same as the x value of the data point afterward and a y value which is the y value of the data point afterward plus deltay. Knowing these two points, a linear equation which defines the upper bound line can be determined. The linear equation has a form of "y=mx+b", wherein "m" is the slope of the line, and "b" is the y-intercept of the line. The current data point and the next data point provide two points on the line from which the slope and the y-intercept can be calculated. Following the traditional principles of algebra, the slope is determined as: $m=(y_{first}-(y_{second}+deltay))/(x_{first}-x_{second})$. The y-intercept is determined as: $b=y_{first}-m*x_{first}$.

Referring to block 305, a line that marks a lower bound of the beam is defined. The line is defined by two points that are known. The first point is one of the data points. The second point is a lower delta that has an x value which is the same as the x value of the data point afterward and a y value which is the y value of the data point afterward minus deltay. Knowing these two points, a linear equation which defines the lower bound line can be determined. The linear equation has a form of "y=mx+b", wherein "m" is the slope of the line, and "b" is the y-intercept of the line. The current data point and the next data point provide two points on the line from which the slope and the y-intercept can be calculated. Following the traditional principles of algebra, the slope is determined as: $m=(y_{first}-(y_{second}-deltay))/(x_{first}-x_{second})$. The y-intercept is determined as: $b=y_{first}-M*X_{first}$.

Referring to block 306, each data point is evaluated in succession as they are received. Hence, the first time this step is executed, data point S0 at time t0 is the current data point and data point S1 at time t1 is the next data point. The second time this step is executed data point S1 at time t1 is the current data point and data point S2 at time t2 is the next data point, and so forth.

Referring to block 307, it is determined whether the current data point is the last data point. If so, then block 308 is the next step. If not, then block 309 is the next step.

Referring to block 308, the current data point is included in the results array. This occurs when the last data point is evaluated, because the last data point is always included in the results in order to provide an indication of the end of the sampled data.

Referring to block 309, it is determined whether the current data point is the first data point or the second data point. If so, then block 310 is the next step. If not, then block 311 is the next step.

Referring to block 310, the current data point is included in the results array. The first two data points are included in the results in order to be able to derive the original sampling period time, as optional data.

Referring to block 311, it is determined whether the previous data point was retained in the results array. If so, then block 312 is the next step. If not, then block 313 is the next step.

Referring to block 312, the previous data point and the current data point are used to generate the upper bound line and the lower bound line. This step either defines the beam for the first time or redefines the beam thereafter. The previous data point was outside the bounds of the previous beam or was the second data point (which always serves as the starting point of the beam). Each time a data point is outside the beam, the previous data point serves as the starting point of the beam. As covered in the steps of blocks 304 and 305, the upper bound line and the lower bound line are determined. The linear equation for the upper bound line is determined to include the two points of the starting point $(x_{previous}, y_{previous})$ and the upper delta point $(x_{current}, y_{current}$ deltay). The linear equation for the lower bound line is determined to include the two points of the starting point $(x_{previous}, y_{previous})$ and the lower delta point $(x_{current}, y_{current}$ –deltay). Given that the new beam is established, the next step is to evaluate the next data point to determine if it is within the beam as performed in block 306.

Referring to block 313, it is determined whether the current data point is out of bounds of the beam. The determination is made by solving the upper bound and lower bound linear equations for y. The x value of the current data point (which may also be a time value) is plugged into the linear equations for the upper bound line and the lower bound line. The slope and the y-intercept for each equation are already known and plugged in. The solution for y for the upper bound linear equation is an upper bound point at the current data point, while the solution for y for the lower bound linear equation is a lower bound point at the current data point. If the y value of the current data point is less than or equal to the y value of the upper bound point and greater than or equal to the y value of the lower bound point, then the current data point is within the beam. It is not stored in the results array, and the next step is block 316. If the y value of the current data point is greater than the y value of the upper bound point or less than the y value of the lower bound point, then the current data point is outside the beam and the next step is block 314.

Referring to block 314, the previous data point is stored in the results array (because the current data point is outside the beam).

Referring to block 315, the current data point is evaluated again so that the beam can be redefined in the step of block 312. The next step is block 307.

Referring to block 316, the start data point and the current data point are used to generate a temporary upper bound line and a temporary lower bound line. This step narrows the beam, at least temporarily. The linear equation for the temporary upper bound line is determined to include the start point of the current beam and a current upper delta point which is the upper delta point of the current data point. The linear equation for the temporary lower bound line is determined to include the start point of the current beam and a current lower delta point which is the lower delta point of the current data point. Furthermore, since the current data point is within the beam, it is discarded and not stored in the results array.

Referring to block 317, it is determined whether the current lower delta point is greater than a current lower bound point. The current lower bound point is a point on the current lower bound line at the x value of the current data point. Depending on the change in slope of the waveform and/or the magnitude of deltay, it is possible that the temporary lower bound line (or temporary upper bound line, as discussed below) does not narrow the beam. This step determines whether the temporary lower bound line narrows the beam by comparing the current lower delta point to the current lower bound point. The current lower delta point has a y value that is equal to the y value of the current data point minus deltay. The current lower bound point is calculated by solving the linear equation of the current lower bound line for y by plugging in the x value of the current data point. If (the y value of) the current lower delta point is greater than (the y value of) the current lower bound point, then the beam has been narrowed, and the next step is block 318. If the current lower delta point is less than or equal to the current lower bound point, then the beam has not been narrowed, and the next step is block 319.

Referring to block 318, the current lower bound line is updated to the temporary lower bound line. That is, the linear equation defining the current lower bound line is updated to include the start point of the current beam and the current lower delta point. The next step is block 320.

Referring to block 319, the current lower bound line is not updated. The next step is block 320.

Referring to block 320, it is determined whether the current upper delta point is less than a current upper bound point. The current upper bound point is a point on the current upper bound line at the x value of the current data point. As with the lower bound line discussed above, it is possible that the temporary upper bound line does not narrow the beam. The current upper delta point has a y value that is equal to the y value of the current data point plus deltay. The current upper bound point is calculated by solving the linear equation of the current upper bound line for y by plugging in the x value of the current data point. The current upper delta point is compared to the current upper bound point. If (the y value of) the current upper delta point is less than (the y value of) the current upper bound point, then the beam has been narrowed, and the next step is block 321. If the current upper delta point is greater than or equal to the current upper bound point, then the beam has not been narrowed, and the next step is block 322.

Referring to block 321, the current upper bound line is updated to the temporary upper bound line. That is, the linear equation defining the current upper bound line is updated to include the start point of the current beam and the current upper delta point. The next step is block 306 to evaluate the next data point.

Referring to block 322, the current upper bound line is not updated. The next step is block 306 to evaluate the next data point.

Referring to FIGS. 12, 13, and 14, applying the algorithm 300 to a few data points of a sampled waveform is illustrated. In FIG. 12, data points S0-S3 at times t0-t3 are shown. In FIG. 13, the same data points S0-S3 at times t0-t3 are shown along with data points S4 and S5 (although they are not labeled) at times t4 and t5. In applying the algorithm 300 to the waveforms, the first two data points, S0 and S1 are retained and stored by default, and a beam is not yet formed when evaluating S0 and S1. When data point S2 is evaluated, the previous data point, S1, was retained, so the step of block 312 is performed and a beam is defined such that the upper bound line is formed to include the previous data point, S1, and the upper delta point for data point S2. The lower bound line is formed to include the previous data point, S1, and the lower delta point for data point S2, as shown in FIG. 12. In FIG. 13, the upper bound line and the lower bound line determined in this step are shown as upper bound line 1 and lower bound line 1, respectively. The upper delta point for the current data point S2 and the lower delta point for data point S2 are shown as solid black dots aligned with time t2.

The next data point, S3 at time t3, is then evaluated as the current data point. Because data point S3 lies within the beam, the algorithm 300 flows through to block 316, wherein the step of temporarily narrowing the beam is performed. Also, the current data point, S3, is not stored in the results array. The temporary upper bound line and the temporary lower bound line determined in this step are shown in FIG. 13 as upper bound line 2 and lower bound line 2. The upper delta point for the current data point S3 and the lower delta point for data point S3 are shown as solid black dots aligned with time t3. As determined in the steps of blocks 317, 318, 320, and 321, the current lower delta point is greater than the current lower bound point, and the current upper delta point is less than the current upper bound point indicating that the temporary upper bound line and the temporary lower bound line are within the current bounds. So the temporary upper bound line and the temporary lower bound line are now the current upper bound line and the current lower bound line, respectively.

The next data point, S4 at time t4, is then evaluated as the current data point. As with data point S3 discussed above, because data point S4 lies within the beam, the algorithm 300 flows through to block 316, wherein the step of temporarily narrowing the beam is performed, and the current data point, S4, is not stored in the results array. The temporary upper bound line and the temporary lower bound line determined in this step are shown in FIG. 13 as upper bound line 3 and lower bound line 3, respectively. The temporary upper bound line and the temporary lower bound line are within the current bounds as determined in the steps of blocks 317, 318, 320, and 321. So the temporary upper bound line and the temporary lower bound line are now the current upper bound line and the current lower bound line, respectively.

The next data point, S5 at time t5, is then evaluated as the current data point. Because data point S5 lies outside the beam, the algorithm 300 flows through to block 314, wherein the step of storing the previous data point, S4, in the results array is performed. Afterward, the algorithm 300 flows to the step of block 312, because the previous data point, S4, was retained. Although not shown in the figures, a new beam is created which uses the previous data point, S4, and the current upper delta point to form the upper bound line, and the previous data point, S4, and the current lower delta point to form the lower bound line.

An alternative scenario in which one of the temporary bound lines does not narrow the beam is illustrated in FIG. 14. The algorithm 300 is applied in the same manner as described above for data points S0-S3. The difference occurs when data point S4 at time t4 is the current data point. Because data point S4 lies within the beam, the algorithm 300 flows through to block 316, wherein the step of temporarily narrowing the beam is performed. Also, the current data point, S4, is not stored in the results array. The temporary upper bound line and the temporary lower bound line determined in this step are shown in FIG. 14 as upper bound line 3 and lower bound line 3, respectively. The upper delta point for the current data point S4 and the lower delta point for data point S4 are shown as solid black dots aligned with time t4. As determined in the steps of blocks 317 and 318, the current lower delta point is greater than the current lower bound point, so the temporary lower bound line is now the current lower bound line—which is shown as lower bound line 3 in FIG. 14. But, as determined in the steps of blocks 320 and 322, the current upper delta point is not less than the current upper bound point—indicating that the temporary upper bound line did not narrow the beam. So the temporary upper bound line is rejected and the current upper bound line remains—which is shown as upper bound line 2 in FIG. 14.

Referring to FIGS. 15-19, the application of the algorithm 300 to the waveform of FIG. 2 is illustrated. As shown in FIG. 15, the first beam is created at data point 51 and includes data point S2 plus and minus deltay. Data points S0 and S1 are retained in the results array by default. The beam is successively narrowed at data points S3 and S4. Data points S2 and S3 are not retained. Data point S5 is outside of the beam, resulting in the beam needing to be redefined and data point S4 being retained in the results array.

In FIG. 16, a second beam is created at data point S4 and includes data point S5 plus and minus deltay. The beam is successively narrowed at data points S6, S7, and S8. Data points S5, S6, and S7 are not retained. Data point S9 is outside of the beam, resulting in the beam needing to be redefined and data point S8 being retained in the results array.

In FIG. 17, a third beam is created at data point S8 and includes data point S9 plus and minus deltay. The beam is successively narrowed at data points S10 and S11. Data points S9, S10, and S11 are not retained. Data point S13 is outside of the beam, resulting in the beam needing to be redefined and data point S12 being retained in the results array.

In FIG. 18, a fourth beam is created at data point S12 and includes data point S13 plus and minus deltay. The beam is successively narrowed at data points S14, S15, and S16. Data points S13, S14, and S15 are not retained. Data point S17 is outside of the beam, resulting in the beam needing to be redefined and data point S16 being retained in the results array.

In FIG. 19, a fifth beam is created at data point S16 and includes data point S17 plus and minus deltay. The beam is successively narrowed at data points S18 and S19. Data points S17, S18, and S19 are not retained. Data point S20 is the last point of the waveform and is retained in the results array by default. The results of applying algorithm 300 to the waveform of FIG. 2 are the same as applying algorithm 100 to the waveform of FIG. 2. And, the contents of the results array are the same as the contents of the combination of outputamplitude and outputtime, as shown in FIG. 7.

Yet another embodiment of the current invention provides a method 400 for compressing data that has been sampled from an analog waveform. At least a portion of the steps of the method 400 are shown in the flow diagram in FIGS. 20A and 20B. The steps may be performed in the order shown in FIGS. 20A and 20B, or they may be performed in a different order. Furthermore, some steps may be performed concurrently as opposed to sequentially. In addition, some steps may be optional or may not be performed. The steps may be performed by the processing element 14 of the computing device 10 via hardware, software, firmware, or combinations thereof. Furthermore, the steps may be implemented as instructions, code, code segments, code statements, a program, an application, an app, a process, a service, a daemon, or the like, and may be stored on a computer-readable storage medium, such as the memory element 12.

Referring to step 401, a stream of sampled data points is received. Each data point includes an x value, which has a time, such as a sample time (t0, t1, t2, etc., as shown in the figures) associated with it, and a y value.

Referring to step 402, an array of retained data point named "results" is defined. In order to compress the data sampled from the waveform, the algorithm 300 only keeps those data points which meet a certain criteria. The remaining data points are discarded. The results array stores the data points which are retained.

Referring to step 403, "deltay" is defined as a range of y values outside of which data points may be retained, while inside of which data points may be discarded. deltay is used to define an upper bound line and a lower bound line. deltay is typically chosen by the user and has a real number value greater than or equal to 0. Generally, the larger the value of deltay, the farther apart the upper and lower bound lines, the greater the output amplitude uncertainty, and the greater the compression—as a result of more data points being within the bound lines and getting discarded. Larger values of deltay result in more lossy compression. The smaller the value of deltay, the closer together the upper and lower bound lines, the less the output amplitude uncertainty, and the less the compression—as a result of fewer data points being within the bound lines and getting discarded. Smaller values of deltay result in less lossy compression. A value of zero for deltay results in lossless compression.

Referring to step 404, a line that marks an upper bound of the beam is defined. The line is defined by two points that are known. The first point is one of the data points. The second point is an upper delta point that has an x value which is the same as the x value of the data point afterward and a y value which is the y value of the data point afterward plus deltay. Knowing these two points, a linear equation which defines the upper bound line can be determined. The linear equation has a form of "y=mx+b", wherein "m" is the slope of the line, and "b" is the y-intercept of the line. The current data point and the next data point provide two points on the line from which the slope and the y-intercept can be calculated. Following the traditional principles of algebra, the slope is determined as: $m=(y_{first}-(y_{second}-\text{deltay}))/(x_{first}-x_{second})$. The y-intercept is determined as: $b=y_{first}-m*x_{first}$. The first time that the upper bound line is determined, the starting point is the second data point and the upper delta point is the third data point plus deltay.

Referring to step 405, a line that marks a lower bound of the beam is defined. The line is defined by two points that are known. The first point is one of the data points. The second point is a lower delta that has an x value which is the same as the x value of the data point afterward and a y value which is the y value of the data point afterward minus deltay. Knowing these two points, a linear equation which defines the lower bound line can be determined. The linear equation has a form of "y=mx+b", wherein "m" is the slope of the line, and "b" is the y-intercept of the line. The current data point and the next data point provide two points on the line from which the slope and the y-intercept can be calculated. Following the traditional principles of algebra, the slope is determined as: $m=(y_{first}-(y_{second}-\text{deltay}))/(x_{first}-x_{second})$. The y-intercept is determined as: $b=y_{first}-M*x_{first}$. The first time that the lower bound line is determined, the starting point is the second data point and the upper delta point is the third data point minus deltay.

Referring to step 406, for each successive data point that is located between the upper and lower bound lines, determine a new upper bound line which includes the starting data point and the upper delta point if the upper delta point is less than an upper bound point. Each data point is evaluated in succession as they are received. The first time this step is executed, data point S2 at time t2 (the third data point) is the current data point. The second time this step is executed data point S3 at time t3 is the current data point, and so forth.

The calculation for whether a data point is located between the upper and lower bound lines involves solving the upper bound and lower bound linear equations for y. The x value of the current data point (which may also be a time value) is plugged into the linear equations for the upper bound line and the lower bound line. The slope and the y-intercept for each equation are already known and plugged in. The solution for y for the upper bound linear equation is the upper bound point at the current data point. If the y value of the current data point is less than or equal to the y value of the upper bound point and greater than or equal to the y value of the lower bound point, then the current data point is located between the upper and lower bound lines.

The linear equation for the new upper bound line is determined to include the start point of the current beam and a current upper delta point which is the upper delta point of the current data point. If (the y value of) the current upper delta point is less than (the y value of) the current upper bound point, then the new upper bound line reduces the area between the upper and lower bound lines. So the new upper bound line becomes the current upper bound line.

Referring to step 407, for each successive data point that is located between the upper and lower bound lines, determine a new lower bound line which includes the starting data point and the lower delta point if the lower delta point is greater than a lower bound point. The process for determining whether a data point is located between the upper and lower bound lines is discussed in step 406. If the current data point is determined to be within the upper and lower bound lines, then the linear equation for the new lower bound line is determined to include the start point of the current beam and a current lower delta point which is the lower delta point of the current data point. If (the y value of) the current lower delta point is less than (the y value of) the current lower bound point, then the new lower bound line reduces the area between the upper and lower bound lines. So the new lower bound line becomes the current lower bound line.

Referring to step 408, for each successive data point that is located between the upper and lower bound lines, do not retain the data point in the results array.

Referring to step 409, for a first successive data point that is not located between the upper and lower bound lines, retain the previous data point in the results array. When a data point is located outside of the upper and lower bound lines, it is an indication that the waveform is changing value significantly enough to save the data.

Referring to step 410, for the first successive data point that is not located between the upper and lower bound lines, determine a new upper bound line which includes the previous data point and the upper delta point. When a data point is located outside of the upper and lower bound lines, then the upper and lower bound lines are re-established.

Referring to step 411, for the first successive data point that is not located between the upper and lower bound lines, determine a new lower bound line which includes the previous data point and the upper delta point. When a data point is located outside of the upper and lower bound lines, then the upper and lower bound lines are re-established.

After the upper and lower bound lines are re-established, the next data point is analyzed at step 406 and the process executed in steps 406-411 repeats.

Referring to FIGS. 21-23, another embodiment of the current invention provides a system 500 for compressing data sampled from an analog waveform signal. The system 500, as shown in FIG. 21, broadly comprises a track and hold unit 502, an analog to digital converter (ADC) 504, a first in first out buffer (FIFO) 506, a data compression unit 508, a serial interface 510, and a controller 512. In the following description, the word "voltage" may be used to describe electric voltage, the word "current" may be used to describe electric current, and the word "power" may be used to describe electric power. In addition, the word "signal" may be used to describe an electromagnetic wave conducted through an electrically conductive medium in which a voltage, a current, and/or a power varies, or may be constant, over time.

The system 500 receives one or more analog waveform input signals, such as an audio signal, a video signal, a sensor signal, or the like. One of the analog waveform input signals is selected and sampled at regular intervals to generate a stream of direct current (DC) voltage levels of the signal. The DC voltage levels are converted into a stream of sampled data points, each having a numeric value. The sampled data points are analyzed to determine changes in the values of the data points. When the values of the data points change sufficiently, at least some of the data points are output as compressed digital data.

The track and hold unit 502 receives a plurality of analog waveform input signals and outputs a DC voltage level for a selected signal. As shown in FIG. 22, an exemplary track and hold unit 502 may include a plurality of sample units 514 and a selector 516. Other configurations or architectures of the track and hold unit 502 are possible. There is one sample unit 514 for each analog waveform input signal, and each sample unit 514 includes a first amplifier 518, a second amplifier 520, a capacitor 522, and a switch 524. Each sample unit 514 also receives a control signal from the controller 512. The first amplifier 518 is configured as an input buffer. The second amplifier 520 is configured as a unity gain amplifier with a high input impedance. The capacitor 522 is configured to retain a DC voltage. The switch 524 is configured as a single-pole, single-throw switch and may be formed from an active device, such as a CMOS transistor, a FET transistor, a bipolar transistor, a diode bridge, or the like, that can be closed or turned on, by the control signal, to allow current flow and opened or turned off, also by the control signal, to prevent current flow. An input of the first amplifier 518 receives one of the analog waveform input signals and an output of the first amplifier 518 is electrically connected to one side of the switch 524. The other side of the switch 524 is electrically connected to one side of the capacitor 522 and to an input of the second amplifier 520. The other side of the capacitor 522 is electrically connected to electrical ground.

The sample unit 514 may operate as follows. The first amplifier 518 receives the analog waveform input signal and outputs the same. The switch 524 is closed for a short, first period of time, as determined by the control signal. During that time, the capacitor 522 is charged to the DC voltage level of the analog waveform input signal, which is output by the second amplifier 520 as the analog sample output. The switch is then opened, as determined by the control signal. The capacitor 522 maintains the DC voltage level, due in part to the high input impedance of the second amplifier 520. The second amplifier 520 also maintains the DC voltage level of the analog sample output. After a relatively longer second period of time, the switch 524 is closed for the first period of time, during which the capacitor 522 is charged to the current DC voltage level of the analog waveform input signal. The DC voltage level is output by the second amplifier 520 as the new analog sample output. The switch 524 is opened, and the aforementioned process continues with the switch being closed and opened on a regular basis. This behavior is illustrated in the plot of voltage vs. time in FIG. 23. The analog waveform input signal is shown as an exemplary sine wave. At times t=0, 1, 2, 3, etc., the switch 524 is briefly closed, and the DC voltage level of the analog waveform input signal is output as a stream of analog samples, which is a stream of DC voltage levels.

The selector 516 receives the stream of DC voltage levels from each sample unit 514, and the select signal from the controller 512. The select signal indicates, by digital data value or by voltage level, the sample unit 514 whose stream of DC voltage levels should be output by the selector 516, and in turn by the track and hold unit 502. For example, if the select signal indicated the first sample unit 514, then the stream of DC voltage levels from the first sample unit 514 is output by the selector 516.

The ADC 504 receives the stream of DC voltage levels from the track and hold unit 502 and converts the stream of DC voltage levels to a stream of sampled data points each including digital data. The ADC 504 may include one of a plurality of electronic circuit architectures, such as direct conversion, successive approximation, ramp compare, Wilkinson, integrating, and so forth. The ADC 504 may receive a control signal from the controller 512 indicating when the ADC 504 should operate or setting performance parameters. The ADC 504 converts each DC voltage level to a number, or numeric value, that varies according to, that corresponds to, or that is proportional to, the level of the voltage such that the number is expressed in digital data form. The ADC 504 may output the sampled data points in a parallel format with a plurality of individual lines, each providing one bit of data, or in a serial format with a single line providing a stream of bits of data.

The FIFO 506 receives sampled data points from the ADC 504 and temporarily stores them. The FIFO 506 may receive a control signal from the controller 512 indicating when the FIFO 506 should operate or setting performance parameters. The FIFO 506 includes a plurality of cells or registers, each capable of storing a sampled data point, that is, the digital data converted from one analog sample output. The FIFO 506 operates in a queue or pipeline format, wherein the sampled data points are output in sequential fashion from the oldest received being output first to the most recently received being output last.

The data compression unit 508 receives the sampled data points from the FIFO 506 and provides compression of the data. The data compression unit 508 may also receive a control signal from the controller 512 indicating when the data compression unit 508 should operate or setting performance parameters. The data compression unit 508 may include or be embodied by the memory element 12 and the processing element 14, as described above. The data compression unit 508 may additionally, or alternatively, include or be embodied by a programmable logic device, such as an FPGA or a microcontroller exemplified by the ATmega328P from Atmel Corporation of San Jose, CA. The programmable logic device may include a plurality of configurable logic blocks electrically connected to one another, wherein each configurable logic block may be configured, programmed, or set up to perform a particular function or operation such that the combination of the configurable logic blocks performs the data compression described herein. The programmable logic device may additionally, or alternatively, include a plurality of registers, one or more arithmetic and logic units, and a control unit that is configured or programmed to perform the data compression methods described herein.

Some embodiments of the data compression unit 508 may implement or execute the algorithm 100, while other embodiments of the data compression unit 508 may implement or execute the algorithm 300. Most embodiments of the data compression unit 508 compress the sampled data points by outputting a portion of the sampled data points that meet a compression criterion. Implementing the algorithm 100, the data compression unit 508 compares a parameter value derived from a plurality of consecutive data points with the compression threshold. If the parameter value is greater than the compression threshold, then at least one of the consecutive data points is output. If the parameter value is less than or equal to the compression threshold, then one or more of the consecutive data points is not output, or is discarded. Implementing the algorithm 300, the data compression unit 508 determines an upper bound line and a lower bound line, each derived from a compression threshold and a plurality of consecutive sampled data points, and compares a value of a data point to a first point on the upper bound line and a second point on the lower bound line. If the data point value lies outside of the upper and lower bound lines, then at least one of the consecutive data points is output. If the data point value lies within the upper and lower bound lines, then one or more of the consecutive data points is not output, or is discarded.

The serial interface 510 receives the compressed data points from the data compression unit 508 and outputs the compressed data points in a serial stream. The serial interface 510 may also receive a control signal from the controller 512 indicating when the serial interface 510 should operate or setting performance parameters. The serial interface 510 may include data storage such as registers and/or memory cells as well as parallel to serial shift registers and other data transmission components.

The controller 512 generates at least one control signal for each of the other components of the system 500. Some control signals may provide information about when the component should operate. Some control signals may provide timing information, such as the control signals for the track and hold unit 502 which close the switch 524 for each sample unit 514. The select signal may provide information about which analog input waveform signal should be processed by the rest of the system 500.

The system 500 may operate as follows. The track and hold unit 502 receives a plurality of analog waveform input signals, selects one of the analog waveform input signals, samples the signal, and outputs a stream of analog direct current (DC) voltage levels of the signal. The ADC 504 receives the stream of DC voltage levels from the track and hold unit 502 and converts the DC voltage levels to a stream of sampled data points, each data point having value that varies according to the voltage level. The FIFO 506 receives the stream of sampled data points from the ADC 504 and temporarily stores the data points before outputting the data points in the order in which they were received. The data compression unit 508 receives the stream of sampled data points. The data compression unit 508 may implement the algorithm 100 or the algorithm 300, wherein the data compression unit 508 compresses the sampled data points by outputting a portion of the data points that meet a compression criterion. The serial interface 510 outputs the selected data points that meet the compression criterion in a serial fashion.

Yet another embodiment of the current invention provides a method 600 for compressing data sampled from an analog waveform signal. At least a portion of the steps of the method 600 are shown in the flow diagram in FIG. 24. The steps may be performed in the order shown in FIG. 24, or they may be performed in a different order. Furthermore, some steps may be performed concurrently as opposed to sequentially. In addition, some steps may be optional or may not be performed. The method 600 may be performed using the system 500 of FIG. 21.

Referring to step 601, one or more analog waveform input signals is received. The signals may include or be embodied by an audio signal, a video signal, a sensor signal, or the like.

Referring to step 602, one of the analog waveform input signals is selected. The analog waveform input signals may be received by the track and hold unit 502 which receives a select signal from the controller to select a particular analog waveform input signal.

Referring to step 603, the selected analog waveform input signal is sampled at regular intervals. The analog waveform input signal may be sampled by one of the sample units 514 of the track and hold unit 502.

Referring to step 604, a stream of DC voltage levels from the selected analog waveform input signal is generated. Each voltage level is generated when the analog waveform input signal is sampled by the sample unit 514.

Referring to step 605, the stream of DC voltage levels is converted to a stream of sampled data points. The DC voltage levels are received by the ADC 504 which converts each DC voltage level to a data point that has a numeric value that varies according to, that corresponds to, or that is proportional to, the level of the voltage such that the number is expressed in digital data form. The data points may be temporarily stored in the FIFO 506 buffer.

Referring to step 606, the sampled data points are compressed by outputting a portion of the sampled data points that meet a compression criterion. The sampled data points are received by the data compression unit 508. In some embodiments, the data compression unit 508 compares a parameter value derived from a plurality of consecutive data points with the compression threshold. If the parameter value is greater than the compression threshold, then at least one of the consecutive data points is output. If the parameter value is less than or equal to the compression threshold, then one or more of the consecutive data points is not output, or is discarded. In other embodiments, the data compression unit 508 determines an upper bound line and a lower bound line, each derived from a compression threshold and a plurality of consecutive data points, and compares a value of a data point to a first point on the upper bound line and a second point on the lower bound line. If the data point value lies outside of the upper and lower bound lines, then at least one of the consecutive data points is output. If the data point value lies within the upper and lower bound lines, then one or more of the consecutive data points is not output, or is discarded.

Referring to FIGS. 25 and 26, a video data compression system 700, constructed in accordance with various embodiments of the current invention, is shown. The video data compression system 700 may be utilized for video data compression with a video camera 702 that includes a video sensor 704, such as a charge-coupled device (CCD), a complementary metal oxide semiconductor (CMOS) sensor, or the like, to capture video.

The video sensor 704 includes a plurality of pixels 706 (picture elements) that are arranged in an array, or a grid, with a first number of pixels 706 in the X direction and a second number of pixels in the Y direction. In the exemplary video sensor 704 of FIG. 26, there are 24 pixels 706 in the X direction and 14 pixels 706 in the Y direction. Each pixel 706 receives a portion of the light that is focused on to the video sensor 704. In some embodiments, each pixel 706 may include a single detector that is sensitive to the intensity of light which it receives and may function as a grayscale pixel. In other embodiments, each pixel 706 may include a plurality of subpixels, such as red, green, and blue (RGB), which are each sensitive to a particular color, for example, a wavelength, or range of wavelengths. Each pixel 706 outputs a digital data value which may be considered raw data and which varies according to the intensity and/or color of the light and may also include a register that stores the digital data value. The range of digital data values for a grayscale pixel 706 depends on the size of the register accompanying the pixel 706. Exemplary ranges include 0-255 for an 8-bit register or 0-1023 for a 10-bit register. The range of digital data values for a color pixel 706 depends on the size of the register for each subpixel. Exemplary subpixels may have an 8-bit, a 10-bit, or a 12-bit register or so forth. The color pixel 706 may output a single digital data value which is the value for the combination of the subpixel registers, or the color pixel 706 may output a separate digital data value for each subpixel. The digital data values output by the pixels 706 are considered video data.

While the video sensor 704 is capturing video, it may take what amounts to a series of still images at a particular frame rate, wherein each still image forms a frame. Typical frame rates may include 24 frames per second (fps), 30 fps, 48 fps, 60 fps, and so forth. During each frame, each pixel 706 outputs a single video data value, or three video data values—depending on the type of pixel 706. By extension, during each frame, the video sensor 704 outputs the video data for all of the pixels 706. Typically, the video sensor 704 may serialize the data into a video data stream such as the one listed in FIG. 27. As an example, during the first frame, the video data stream may include the video data for the pixel at location (1,1), followed by the video data for the pixel 706 at location (2,1), and so forth until the video data for the last pixel 706 at location (24,14). The video sensor 704 may output the video data in a different order, but generally the video data is output in an order that follows a raster, i.e., all of the pixels 706 in a row, each row in turn. The video sensor 704 then outputs the video data stream for one frame after another as the video is captured. The video data stream may also include additional information such as headers, timestamps, frame identifiers, etc.

In some embodiments, the video data compression system 700 may be integrated with the video sensor 704 in the same package or on the same substrate such as a printed circuit board or flexible circuit. In other embodiments, the video data compression system 700 may be packaged or housed externally to the video camera 702 and may be in electronic communication either wirelessly or through an electrically conductive or optical fiber cable.

Alternatively, the video data compression system 700 may be utilized to compress raw video data that has already been stored in a data storage system such as a hard disk drive or a file server 708, as shown in FIG. 28. In this situation, the video data compression system 700 receives the stored data as a video data stream in the same, or similar, fashion as from the video sensor 704 described above.

The video data compression system 700 broadly comprises a data buffer 710, a pixel data extractor 712, a data compression element 714, and a long term storage memory element 716. The video data compression system 700 may further comprise communication elements which transmit and receive data either wirelessly, via protocols such as cellular, WiFi, Bluetooth, etc., or through an electrically conductive cable or optical fiber cable.

The video data compression system 700 may receive timing information, such as a frames per second value and/or timestamp data, along with the video data stream. Additionally, or alternatively, the video data compression system 700 may determine or calculate timing information from the video data stream such as a time value or offset for each frame of video data.

The data buffer 710 generally stores data temporarily for a short period of time. The data buffer 710 may include various data storage structures such as cache memory, random access memory (RAM), shift registers, first in first out (FIFO) registers, or the like, or combinations thereof. The data buffer 710 receives the video data stream from the video sensor 704 or the file server 708 and stores it.

The pixel data extractor 712 generally extracts or retrieves the video data for each pixel 706 one pixel 706 at a time from the data buffer 710. The pixel data extractor 712 may include components that retrieve data or control the flow of data, registers that store data, such as shift registers, FIFO registers, or the like, and control circuitry, such as finite state machines, microprocessors, microcontrollers, or the like, to control the operation of the data retrieval components and the registers. Referring to FIG. 29, the pixel data extractor 712 retrieves the video data for the first pixel 706 for each frame of the captured video in time sequential order. For example, the pixel data extractor 712 retrieves the video data for the pixel 706 at location (1,1) for frame F(1), followed by frame F(2), and so forth through the last frame F(N). In other embodiments, the pixel data extractor 712 may first retrieve the video data for a pixel 706 other than the pixel 706 at location (1,1). The pixel data extractor 712 retrieves the video data for all of the remaining pixels 706. In addition, the pixel data extractor 712 creates a plurality of pixel data streams, wherein each pixel data stream includes the video data for the first frame F(1) through the last frame F(N) for the pixel 706 at a successive location of the video sensor 704. For example, a first pixel data stream includes the video data for the pixel 706 located at (1,1), a second pixel data stream includes the video data for the pixel 706 at location (2,1), and so forth. Referring to FIGS. 30A and 30B, plots of the pixel data stream as the video data value vs frame number for the pixels 706 at location (1,1) and (2,1) are shown. The pixel data extractor 712 outputs the pixel data streams including the first pixel data stream followed by the second pixel data stream and so on until the last pixel data stream is output.

In various embodiments, the pixel data extractor 712 is further configured to partition or divide each pixel data stream into a plurality of segmented pixel data streams or segments, wherein each segmented pixel data stream or segment includes one portion of a variable number of successive portions of video data from the entire pixel data stream. Each segmented pixel data stream may include the video data from one pixel 706 for a fixed or variable number of frames, such as 12, 15, 24, 30, etc., or a fixed or variable time period, such as 100 milliseconds, 500 milliseconds, 1 second, etc. The length of each segmented pixel data stream may additionally, or alternatively, be determined by the content of the pixel data stream. For example, the boundary between one segmented pixel data stream and the proceeding segmented pixel data stream may occur when the video data value is equal to, greater than, or less than a threshold value (which may be related to a particular color) or is within a range of values. Thus, the pixel data extractor 712 is also configured to evaluate the video data of each frame for each pixel data stream.

The pixel data extractor 712 extracts the video data from the data buffer 710 and outputs the corresponding, or like-numbered, segmented pixel data stream of each pixel for each successive segmented pixel data stream. That is, the pixel data extractor 712 extracts the video data from the data buffer 710 and outputs the first segmented pixel data stream for each pixel 706 followed by the second segmented pixel data stream for each pixel 706 followed by the third segmented pixel data stream for each pixel 706 and so forth. Referring to FIG. 31, for example, if each segmented pixel data stream is 30 frames of video data, then the pixel data extractor 712 extracts 30 frames of video data from the data buffer 710 for the first pixel 706 and outputs a first segmented pixel data stream for the first pixel 706. The pixel data extractor 712 extracts 30 frames of video data from the data buffer 710 for the second pixel 706 and outputs a first segmented pixel data stream for the second pixel 706. The pixel data extractor 712 extracts 30 frames of video data from the data buffer 710 for the third pixel 706 and outputs a first segmented pixel data stream for the third pixel 706 and so forth for all the remaining pixels 706. The process then continues as described below.

Many data compression algorithms that compress streams of data often analyze the relationship between a plurality of sequential data points (e.g., 2 or 3 sequential data points) in order to determine whether any given data point should be saved or discarded. In order to avoid loss of data, or a discontinuity, in the data compression process (by the data compression element 714) from one segmented pixel data stream to the next segmented pixel data stream for each pixel 706, the pixel data extractor 712 extracts at least the last video data value that was part of the previous segmented pixel data stream when extracting the video data from the data buffer 710 for the current segmented pixel data stream. Referring to FIG. 31, to continue the example from above, if each segmented pixel data stream is 30 frames of video data, then for a second segmented pixel data stream of the first pixel 706, the pixel data extractor 712 extracts at least frame #30, which was part of the first segmented pixel data stream, along with frames #31 through #60 of video data from the data buffer 710 for the first pixel 706—which will be part of the second segmented pixel data stream. The pixel data extractor 712 outputs frames #30 through #60 as the second segmented pixel data stream. The pixel data extractor 712 extracts frames #30 through #60 from the data buffer 710 and outputs frames #30 through #60 as the second segmented pixel data stream for each pixel 706. The process continues for the subsequent segmented pixel data streams. It is noted that in FIG. 31, three segments or segmented pixel data streams are shown, but for each pixel 706, there are actually as many segments or segmented pixel data streams as are necessary to compress the entire stream of video. In some embodiments, the pixel data extractor 712 may include a register, buffer, or cache which stores the last one or two frames of video data for each segmented pixel data stream for each pixel 706 so that the last frames of data do not need to be stored in the data buffer 710.

The data compression element 714 generally compresses the pixel data streams or the segmented pixel data streams from the pixel data extractor 712. The data compression element 714 may include any components or modules that are configured to compress a digital data stream such as the ones shown in FIGS. 30A and 30B. Exemplary embodiments of the data compression element 714 include the memory element 12 and the processing element 14 of FIG. 3 programmed or configured to perform the methods and/or algorithms of FIGS. 4A, 4B, 4C, 10, 11A, 11B, 20A, and 20B, and the system 500 of FIGS. 21 and 22, among others. The data compression element 714 outputs compressed data from each pixel data stream. For example, using the components, methods, and/or algorithms of various embodiments of the current invention, the data compression element 714 receives the pixel data stream that originated from the first pixel 706 of the video sensor 704, that is, the pixel 706 at location (1,1), and outputs the video data for each frame of video which is part of a plurality of frames of video data that meet the data compression criteria, as described above for the various components, methods, and/or algorithms. The data compression element 714 receives the pixel data stream from each of the subsequent pixels 706 and outputs the compressed result for video data which originated from each pixel 706 such that the result is a collection of selected video data values for each pixel 706. As shown in FIG. 32, the output of the data compression element 714 is the compressed video data for each pixel 706, which includes the video data for each frame of the video which meets the data compression criteria. In various embodiments, the output for each pixel 706 includes the video data for the first two frames, F(1) and F(2), and the last frame, F(N), to identify the start and the end of the video so that the original video data can be reconstructed from the compressed video data.

Alternatively, the data compression element 714 outputs compressed data from each segmented pixel data stream. For example, using the components, methods, and/or algorithms of various embodiments of the current invention, the data compression element 714 receives the first segmented pixel data stream that originated from the first pixel 706 of the video sensor 704, that is, the pixel 706 at location (1,1), and outputs the video data for each frame of video which is part of a plurality of frames of video data that meet the data compression criteria, as described above for the various components, methods, and/or algorithms. The data compression element 714 receives the first segmented pixel data stream from each of the subsequent pixels 706 and outputs the compressed result for the first segment of video data which originated from each pixel 706 such that the result is a collection of selected video data values for a first segment of video data for each pixel 706. The data compression element 714 receives the segmented pixel data stream from each of the subsequent pixels 706 for the remaining segments and outputs the compressed result.

The long term storage memory element 716 generally stores the compressed video data. The long term storage memory element 716 may be embodied by devices or components that store data in general, and digital or binary data in particular, and may include exemplary electronic hardware data storage devices or components such as cache memory, hard disks, floppy disks, optical disks, flash memory, thumb drives, universal serial bus (USB) drives, solid state memory, or the like, or combinations thereof. The long term storage memory element 716 may further include or be embodied by the file server 708. The long term storage memory element 716 receives the compressed video data from the data compression element 714 either wirelessly or through electrically conductive cabling or through optical fibers. In general, the long term storage memory element 716 stores data such that all of the compressed data, segmented and/or unsegmented, is associated or linked with the correct pixel 706.

The video data compression system 700 may operate as follows. The data buffer 710 receives the video data stream from the video sensor 704 or the file server 708 and stores it. The video data stream typically includes a sequence of video data from each of the pixels 706 of the video sensor 704 for a first frame of video followed by the video data from each of the pixels 706 for subsequent frames. The pixel data extractor 712 extracts the video data (i.e., the digital data values) from the data buffer 710 for the first pixel 706 for all of the frames of the captured video in time sequential order and outputs the video data as a pixel data stream for the first pixel 706. The pixel data extractor 712 also extracts the video data from the data buffer 710 for all of the frames of the captured video in time sequential order for the subsequent pixels 706 and outputs the video data as one pixel data stream for each subsequent pixel 706. The data compression element 714 receives the pixel data streams and outputs compressed video data for each pixel 706. The long term storage memory element 716 receives the compressed video data from the data compression element 714 and stores it. In various embodiments, the video data compression system 700 may transmit the compressed video data to external systems or devices.

For embodiments in which the pixel data extractor 712 partitions or divides the pixel data streams into segmented pixel data streams, the data buffer 710 receives the video data stream from the video sensor 704 or the file server 708 and stores it, as mentioned above. The pixel data extractor 712 retrieves the video data from the data buffer 710 for the first segmented pixel data stream for each pixel 706. The pixel data extractor 712 may temporarily store at least the video data value for the last frame of the first segmented pixel data stream for each pixel 706. The pixel data extractor 712 outputs the first segmented pixel data stream for each pixel 706. The pixel data extractor 712 extracts the video data for the second segmented pixel data stream for each pixel 706 from the data buffer 710 and concatenates at least the video data value for the last frame of the first segmented pixel data stream to the beginning of the second segmented pixel data stream for each pixel 706. The pixel data extractor 712 outputs the second segmented pixel data stream for each pixel 706. The pixel data extractor 712 repeats the extracting and concatenating process for all of the subsequent segmented pixel data streams. The number of frames of video data included in each segmented pixel data stream may vary according to an adjustable value of the number of frames, an adjustable time period, a value of the video data from one or more pixels 706, or the like. The data compression element 714 receives the segmented pixel data streams and outputs compressed video data for each segment for each pixel 706. The long term storage memory element 716 receives the compressed video data from the data compression element 714 and stores it, maintaining the association of the segments of compressed data with the appropriate pixel 706. In various embodiments, the video data compression system 700 may transmit the compressed video data to external systems or devices.

Being able to segment the pixel data streams allows the video data compression system 700 to compress at least a portion of the video data for all of the pixels 706 of the video sensor 704 without having to compress the entire stream of video data for any one pixel 706. Thus, the video data compression system 700 is configured to compress the video data during a video streaming event by compressing the video data for all of the pixels 706 segment by segment.

Referring to FIGS. 33 and 34, another embodiment of the video data compression system 800 is shown. The video data compression system 800 may be utilized to compress video data from a video sensor 704 in a video camera 702 or video data that was previously stored in a file server 708 or the like. The video data compression system 800 broadly comprises a data buffer 810, a pixel cluster data extractor 812, a data compression element 814, and a long term storage memory element 816. The data buffer 810, the data compression element 814, and the long term storage memory element 816 are similar to, or the same as, the data buffer 710, the data compression element 714, and the long term storage memory element 716, respectively, in structure, function, and operation. In addition, the video data compression system 800 may receive timing information, such as a frames per second value and/or timestamp data, along with the video data stream. Additionally, or alternatively, the video data compression system 800 may determine or calculate timing information from the video data stream such as a time value or offset for each frame of video data.

The pixel cluster data extractor 812 is similar to the pixel data extractor 712 and includes include components that retrieve data or control the flow of data, registers that store data, such as shift registers, FIFO registers, or the like, and control circuitry, such as finite state machines, microprocessors, microcontrollers, or the like, to control the operation of the data retrieval components and the registers. The pixel cluster data extractor 812, like the pixel data extractor 712, generally extracts or retrieves the video data from the data buffer 810 in order to output the video data to the data compression element 814. But, instead of retrieving the video data for a single pixel 706, the pixel cluster data extractor 812 retrieves the video data for one or more pixels 706 for each frame of video. Typically, the pixel cluster data extractor 812 retrieves the video data for a cluster of pixels 706, that is, a group of pixels 706 that are positioned adjacent to one another. The cluster may have a square shape, such as 2×2, 3×3, 4×4, etc., or a rectangular shape, such as 1×2, 2×3, 2×4, 3×4, etc. In various embodiments, the cluster may have a shape that corresponds to, or varies according to, an aspect ratio of the video sensor 704. Furthermore, the clusters may be non-overlapping, wherein each pixel 706 is included in only one cluster, or overlapping, wherein each pixel 706 is included in one or more clusters. In addition, the number of pixels 706 included in a cluster may vary from cluster to cluster such that some clusters may include only one pixel 706 and other clusters include more than one pixel 706. The number of pixels 706 included in a cluster may be predetermined or may be determined or adjusted dynamically through execution of a cluster sizing algorithm or artificial intelligence routine.

In general, as shown in FIG. 34, the pixel cluster data extractor 812 retrieves the video data for a first pixel 706, P(X,Y), a second pixel 706 offset from the first pixel 706 in the X direction, P(X+1,Y), a third pixel 706 offset from the first pixel 706 in the Y direction, P(X,Y+1), a fourth pixel 706 offset from the first pixel 706 in both the X direction and the Y direction, P(X+1,Y+1), and so forth through the last pixel 706, P(X+I,Y+J), where I and J determine the size of the cluster in the X direction and the Y direction, respectively. For example, if the cluster is sized to be 2×3, the pixel cluster data extractor 812 retrieves the video data for pixels 706 at locations (1,1), (2,1), (1,2), (2,2), (2, 3), and (2,4). In addition, the pixel cluster data extractor 812 retrieves the video data for the cluster of pixels 706 for each frame of the captured video in time sequential order. Continuing the example, the pixel cluster data extractor 812 retrieves the video data for pixels 706 at the listed locations for the first frame, F(1), followed by the second frame, F(2), and so forth through the last frame, F(N). After the pixel cluster data extractor 812 retrieves the video data for all of the frames of the first cluster of pixels 706, the pixel cluster data extractor 812 retrieves the video data for all of the frames of each of the subsequent clusters of pixels 706.

Referring to FIG. 34, the pixel cluster data extractor 812 also includes a mathematical and logic function element 818 that receives the video data from the cluster of pixels 706. The mathematical and logic function element 818 may include combinational logic, sequential logic, finite state machines, arithmetic logic units, microprocessors, microcontrollers, or the like, or combinations thereof. The mathematical and logic function element 818 receives all of the video data from the pixels 706 in a cluster for a given frame of video and determines, computes, or calculates a mathematical function, such as a maximum value, minimum value, mean (average) value, median value, or the like, of the data. The mathematical and logic function element 818 outputs a result of the mathematical function, P(CLUSTER), that is the average (or other function) of all of the video data in the cluster of pixels 706 for a given frame. In addition, the mathematical and logic function element 818 may determine, compute, or calculate a logic function, such as AND'ing data, OR'ing data, or INVERT'ing data, on the video data from the pixels 706 in a cluster and output the result of the logic function. Furthermore, the mathematical and logic function element 818 may analyze a conditional statement regarding the video data from the pixels 706 in a cluster and then output a data value, P(CLUSTER), based on the results of the analysis. For example, the mathematical and logic function element 818 may analyze an if . . . then statement, such as: if any of the video data values from the pixels 706 in the cluster is less than a threshold value (which may be related to a particular color), is greater than the threshold value, is equal to the threshold value, or falls within a range of values, then the mathematical and logic function element 818 outputs a target value, P(CLUSTER), which may be the threshold value or another value.

The pixel cluster data extractor 812 retrieves the video data for all of the frames of video for each pixel 706 in a cluster of pixels 706 and outputs the mathematical or logic function result, P(CLUSTER), such as an average, of the video data for all of the cluster of pixels 706 for each frame. Thus, the output includes the mathematical or logic function result of the video data for all of the cluster of pixels 706 for the first frame, F(1), followed by the second frame, F(2), and so forth through the last frame, F(N). In effect, the pixel cluster data extractor 812 creates and outputs a pixel cluster data stream for the cluster of pixels 706. The pixel cluster data extractor 812 then performs the same operation (retrieval and output) for each of the subsequent clusters of pixels 706, thereby creating and outputting a pixel cluster data stream for each subsequent cluster of pixels 706.

Like the pixel data extractor 712, in various embodiments, the pixel cluster data extractor 812 is further configured to partition or divide each pixel cluster data stream into a plurality of segmented pixel cluster data streams or segments, wherein each segmented pixel cluster data stream or segment includes one portion of a variable number of successive portions of video data from the entire pixel cluster data stream. In operation, the pixel cluster data extractor 812 extracts the video data from the data buffer 810 for all of the pixels 706 in a first cluster for a first frame of video and performs the mathematical or logical function evaluation on them to determine the output value of the cluster for the first frame. The pixel cluster data extractor 812 extracts the video data from the data buffer 810 for all of the pixels 706 in the first cluster for the subsequent frames of video in the first segment and performs the mathematical or logical function evaluation on them to determine the output value of the cluster for each frame. The values that are output form the first segmented pixel cluster data stream for the first cluster. The pixel cluster data extractor 812 may store at least the value that was output as part of the first segmented pixel cluster data stream for the first cluster. The pixel cluster data extractor 812 performs the same operation (extraction, evaluation, output) for the remaining clusters and outputs the first segmented pixel cluster data stream for each of the clusters. The pixel cluster data extractor 812 performs the same operation (extraction, evaluation, output) for the next segment for all of the clusters and outputs the next segmented pixel cluster data stream for each of the clusters. The process repeats until all of the segmented pixel cluster data streams for the remaining segments have been output.

The video data compression system 800 may operate as follows. The data buffer 810 receives the video data stream from the video sensor 704 or the file server 708 and stores it. The video data stream typically includes a sequence of video data from each of the pixels 706 of the video sensor 704 for a first frame of video followed by the video data from each of the pixels 706 for subsequent frames. The pixel cluster data extractor 812 retrieves the video data (i.e., the digital data values) from the data buffer 810 for all of the frames of video for each pixel 706 in a cluster of pixels 706 and outputs the pixel cluster data stream which includes the mathematical function result of the video data for all of the cluster of pixels 706 for each frame. The pixel cluster data extractor 812 repeats this process and outputs one pixel cluster data stream for each of the subsequent clusters of pixels 706. The data compression element 814 receives the pixel cluster data streams and outputs compressed video data for each cluster of pixels 706. The long term storage memory element 816 receives the compressed video data from the data compression element 814 and stores it. In various embodiments, the video data compression system 800 may transmit the compressed video data to external systems or devices.

By having the ability to compress the video data from clusters, or groups, of pixels 706, the video data compression system 800 may be utilized to provide data compression and resolution reduction of video data simultaneously. For example, 4 k video, with a resolution of 3840×2160, may, through the use of appropriate cluster sizing, be compressed and stored as high definition (HD) video, with a resolution of 1920×1080. Furthermore, the video data compression system 800 is configured to dynamically adjust the size of the clusters of pixels 706, i.e., the number of pixels 706 in each cluster, based on time or length parameters, such as after various time periods have elapsed or a certain number of frames of video data have been received. The video data compression system 800 is also configured to dynamically adjust the size of the clusters of pixels 706 based on the content of the video data. For example, certain video data values, that perhaps correspond to certain colors, being received may trigger a change in the size of the clusters of pixels 706.

Given that both the video data compression systems 700, 800 utilize components and/or methods that determine the first and second derivatives of a signal or data stream, each video data compression system 700, 800 could be used to perform motion tracking, that is, tracking of visual features or objects whose activity is captured by the video sensor 704.

For embodiments in which the pixel cluster data extractor 812 partitions or divides the pixel data streams into segmented pixel data streams, the data buffer 810 receives the video data stream from the video sensor 704 or the file server 708 and stores it, as mentioned above. The pixel cluster data extractor 812 retrieves the video data from the data buffer 810 for all of the frames of video in a first segment for each pixel 706 in a cluster of pixels 706 and outputs the segmented pixel cluster data stream which includes the mathematical or logic function result of the video data for all of the cluster of pixels 706 for each frame in the first segment. The pixel cluster data extractor 812 repeats this process and outputs one segmented pixel cluster data stream for each of the subsequent clusters of pixels 706 for the first segment. The pixel cluster data extractor 812 also outputs one segmented pixel cluster data stream for each of the clusters of pixels 706 for each remaining segment of video data. The data compression element 814 receives the segmented pixel cluster data streams and outputs compressed video data for each segment for each cluster of pixels 706. The long term storage memory element 816 receives the compressed video data from the data compression element 814 and stores it, maintaining the association of the segments of compressed data with the appropriate cluster of pixels 706. In various embodiments, the video data compression system 800 may transmit the compressed video data to external systems or devices.

Another embodiment of the current invention provides a computer-implemented method 900 for compressing video data. At least a portion of the steps of the method 900 are shown in the flow diagram in FIG. 35. The steps may be performed in the order shown in FIG. 35, or they may be performed in a different order. Furthermore, some steps may be performed concurrently as opposed to sequentially. In addition, some steps may be optional or may not be performed. The method 900 may be performed using the system 700 of FIG. 25 or 28.

Referring to step 901, a sequence of video data values is received. Each video data value is a digital value from a successive one of a plurality of pixels 706 that form the video sensor 704. The sequence of video data values results from successive frames of video captured by the video sensor 704. The video data may be stored or buffered in the data buffer 710 after it is received.

Referring to step 902, the video data values for each pixel 706 are extracted. The video data for each pixel 706 is extracted from the data buffer 710 by the pixel data extractor 712, which creates and outputs a plurality of pixel data streams, each pixel data stream including the video data value for each frame of captured video for the pixel 706. In exemplary embodiments, referring to FIG. 29, the pixel data extractor 712 retrieves the video data for the first pixel 706 for each frame of the captured video in time sequential order. For example, the pixel data extractor 712 retrieves the video data for the pixel 706 at location (1,1) for frame F(1), followed by frame F(2), and so forth through the last frame F(N). In other embodiments, the pixel data extractor 712 may first retrieve the video data for a pixel 706 other than the pixel 706 at location (1,1). The pixel data extractor 712 retrieves the video data for all of the remaining pixels 706. In addition, the pixel data extractor 712 creates a plurality of pixel data streams, wherein each pixel data stream includes the video data for the first frame F(1) through the last frame F(N) for the pixel 706 at a successive location of the video sensor 704. For example, a first pixel data stream includes the video data for the pixel 706 located at (1,1), a second pixel data stream includes the video data for the pixel 706 at location (2,1), and so forth. Referring to FIGS. 30A and 30B, plots of the pixel data stream as the video data value vs frame number for the pixels 706 at location (1,1) and (2,1) are shown. The pixel data extractor 712 outputs the pixel data streams including the first pixel data stream followed by the second pixel data stream and so on until the last pixel data stream is output.

Referring to step 903, data compression is applied to each pixel data stream to create compressed data for each pixel data stream. The data compression is applied by the data compression element 714. The data compression element 714 may include any components or modules that are configured to compress a digital data stream such as the ones shown in FIGS. 30A and 30B. Exemplary embodiments of the data compression element 714 include the memory element 12 and the processing element 14 of FIG. 3 programmed or configured to perform the methods and/or algorithms of FIGS. 4A, 4B, 4C, 10, 11A, 11B, 20A, and 20B, and the system 500 of FIGS. 21 and 22, among others. The data compression element 714 outputs compressed data from each pixel data stream. For example, using the components, methods, and/or algorithms of various embodiments of the current invention, the data compression element 714 receives the pixel data stream from the first pixel 706 of the video sensor 704, that is, the pixel 706 at location (1,1), and outputs the video data for each frame of video which is part of a plurality of frames of video data that meet the data compression criteria, as described above for the various components, methods, and/or algorithms. The data compression element 714 receives the pixel data stream from each of the subsequent pixels 706 and outputs the compressed data from each pixel 706 such that the result is a collection of video data values for each pixel 706. As shown in FIG. 32, the output of the data compression element 714 includes the video data for each frame of the video which is part of a plurality of frames of video data that meet the data compression criteria. In various embodiments, the output for each pixel 706 includes the video data for the first two frames, F(1) and F(2), and the last frame, F(N), to identify the start and the end of the video so that the original video data can be reconstructed from the compressed video data.

Referring to step 904, the compressed data for each pixel stream is stored in the long term storage memory element 716. In other embodiments, the compressed data for each pixel stream may be transmitted to external systems or devices.

Another embodiment of the current invention provides a computer-implemented method 1000 for compressing video data. At least a portion of the steps of the method 1000 are shown in the flow diagram in FIG. 36. The steps may be performed in the order shown in FIG. 36, or they may be performed in a different order. Furthermore, some steps may be performed concurrently as opposed to sequentially. In addition, some steps may be optional or may not be performed. The method 1000 may be performed using the system 800 of FIG. 33.

Referring to step 1001, a sequence of video data values is received. Each video data value is a digital value from a successive one of a plurality of pixels 706 that form the video sensor 704. The sequence of video data values results from successive frames of video captured by the video sensor 704. The video data may be stored or buffered in the data buffer 810 after it is received.

Referring to step 1002, the video data values for each one of a plurality of clusters of pixels 706 are extracted. The video data for each pixel 706 is extracted from the data buffer 810 by the pixel cluster data extractor 812, which retrieves the video data for a plurality of pixels 706. Typically, the pixel cluster data extractor 812 retrieves the video data for a cluster of pixels 706, that is, a group of pixels 706 that are positioned adjacent to one another. The cluster may have a square shape, such as 2×2, 3×3, 4×4, etc., or a rectangular shape, such as 1×2, 2×3, 2×4, 3×4, etc. In various embodiments, the cluster may have a shape that corresponds to, or varies according to, an aspect ratio of the video sensor 704. In general, as shown in FIG. 34, the pixel cluster data extractor 812 retrieves the video data for a first pixel 706, P(X,Y), a second pixel 706 offset from the first pixel 706 in the X direction, P(X+1,Y), a third pixel 706 offset from the first pixel 706 in the Y direction, P(X,Y+1), a fourth pixel 706 offset from the first pixel 706 in both the X direction and the Y direction, P(X+1,Y+1), and so forth through the last pixel 706, P(X+I,Y+J), where I and J determine the size of the cluster in the X direction and the Y direction, respectively. For example, if the cluster is sized to be 2×3, the pixel cluster data extractor 812 retrieves the video data for pixels 706 at locations (1,1), (2,1), (1,2), (2,2), (2, 3), and (2,4). In addition, the pixel cluster data extractor 812 retrieves the video data for the cluster of pixels 706 for each frame of the captured video in time sequential order. Continuing the example, the pixel cluster data extractor 812 retrieves the video data for pixels 706 at the listed locations for the first frame, F(1), followed by the second frame, F(2), and so forth through the last frame, F(N). After the pixel cluster data extractor 812 retrieves the video data for all of the frames of the first cluster of pixels 706, the pixel cluster data extractor 812 retrieves the video data for all of the frames of each of the subsequent clusters of pixels 706.

Referring to step 1003, a mathematical function to each frame of video data for the cluster of pixels 706 is applied. The mathematical function is applied by the mathematical and logic function element 818 which receives all of the video data from the pixels 706 in a cluster for a given frame of video and determines, computes, or calculates a mathematical function, such as a mean (average) value or median value, of the data. The mathematical and logic function element 818 outputs a result of the mathematical function, P(CLUSTER), that is the average (or other function) of all of the video data in the cluster of pixels 706 for a given frame.

The pixel cluster data extractor 812 retrieves the video data for all of the frames of video for each pixel 706 in a cluster of pixels 706 and outputs the mathematical function result, P(CLUSTER), such as an average, of the video data for all of the cluster of pixels 706 for each frame. Thus, the output includes the mathematical function result of the video data for all of the cluster of pixels 706 for the first frame, F(1), followed by the second frame, F(2), and so forth through the last frame, F(N). In effect, the pixel cluster data extractor 812 creates and outputs a pixel cluster data stream for the cluster of pixels 706. The pixel cluster data extractor 812 then performs the same operation (retrieval and output) for each of the subsequent clusters of pixels 706, thereby creating and outputting a pixel cluster data stream for each subsequent cluster of pixels 706.

Referring to step 1004, data compression is applied to each pixel cluster data stream to create compressed data for each pixel cluster data stream. The data compression is applied by the data compression element 814. The data compression element 814 may include any components or modules that are configured to compress a digital data stream such as the ones shown in FIGS. 30A and 30B. Exemplary embodiments of the data compression element 814 include the memory element 12 and the processing element 14 of FIG. 3 programmed or configured to perform the methods and/or algorithms of FIGS. 4A, 4B, 4C, 10, 11A, 11B, 20A, and 20B, and the system 500 of FIGS. 21 and 22, among others. The data compression element 814 outputs compressed data from each pixel cluster data stream.

Referring to step 1005, the compressed data for each pixel stream is stored in the long term storage memory element 816. In other embodiments, the compressed data for each pixel cluster stream may be transmitted to external systems or devices.

ADDITIONAL CONSIDERATIONS

Throughout this specification, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current invention can include a variety of combinations and/or integrations of the embodiments described herein.

Although the present application sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as computer hardware that operates to perform certain operations as described herein.

In various embodiments, computer hardware, such as a processing element, may be implemented as special purpose or as general purpose. For example, the processing element may comprise dedicated circuitry or logic that is permanently configured, such as an application-specific integrated circuit (ASIC), or indefinitely configured, such as an FPGA, to perform certain operations. The processing element may also comprise programmable logic or circuitry (e.g., as encompassed within a general-purpose processor or other programmable processor) that is temporarily configured by software to perform certain operations. It will be appreciated that the decision to implement the processing element as special purpose, in dedicated and permanently configured circuitry, or as general purpose (e.g., configured by software) may be driven by cost and time considerations.

Accordingly, the term "processing element" or equivalents should be understood to encompass a tangible entity, be that an entity that is physically constructed, permanently configured (e.g., hardwired), or temporarily configured (e.g., programmed) to operate in a certain manner or to perform certain operations described herein. Considering embodiments in which the processing element is temporarily configured (e.g., programmed), each of the processing elements need not be configured or instantiated at any one instance in time. For example, where the processing element comprises a general-purpose processor configured using software, the general-purpose processor may be configured as respective different processing elements at different times. Software may accordingly configure the processing element to constitute a particular hardware configuration at one instance of time and to constitute a different hardware configuration at a different instance of time.

Computer hardware components, such as communication elements, memory elements, processing elements, and the like, may provide information to, and receive information from, other computer hardware components. Accordingly, the described computer hardware components may be regarded as being communicatively coupled. Where multiple of such computer hardware components exist contemporaneously, communications may be achieved through signal transmission (e.g., over appropriate circuits and buses) that connect the computer hardware components. In embodiments in which multiple computer hardware components are configured or instantiated at different times, communications between such computer hardware components may be achieved, for example, through the storage and retrieval of information in memory structures to which the multiple computer hardware components have access. For example, one computer hardware component may perform an operation and store the output of that operation in a memory device to which it is communicatively coupled. A further computer hardware component may then, at a later time, access the memory device to retrieve and process the stored output. Computer hardware components may also initiate communications with input or output devices, and may operate on a resource (e.g., a collection of information).

The various operations of example methods described herein may be performed, at least partially, by one or more processing elements that are temporarily configured (e.g., by software) or permanently configured to perform the relevant operations. Whether temporarily or permanently configured, such processing elements may constitute processing element-implemented modules that operate to perform one or more operations or functions. The modules referred to herein may, in some example embodiments, comprise processing element-implemented modules.

Similarly, the methods or routines described herein may be at least partially processing element-implemented. For example, at least some of the operations of a method may be performed by one or more processing elements or processing element-implemented hardware modules. The performance of certain of the operations may be distributed among the one or more processing elements, not only residing within a single machine, but deployed across a number of machines. In some example embodiments, the processing elements may be located in a single location (e.g., within a home environment, an office environment or as a server farm), while in other embodiments the processing elements may be distributed across a number of locations.

Unless specifically stated otherwise, discussions herein using words such as "processing," "computing," "calculating," "determining," "presenting," "displaying," or the like may refer to actions or processes of a machine (e.g., a computer with a processing element and other computer hardware components) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

1. A computer-implemented method for compressing video data, the method comprising:
   receiving a sequence of video data values, each video data value being a digital value from a successive one of a plurality of pixels that form a frame of video, the sequence of video data values resulting from successive frames of video;
   extracting the video data values for each pixel to create a plurality of pixel data streams, each pixel data stream including the video data value for each frame of video for the pixel; and
   applying data compression to each pixel data stream to create compressed data for each pixel data stream.

2. The computer-implemented method of claim 1, further comprising storing the compressed data for each pixel data stream.

3. The computer-implemented method of claim 1, further comprising storing the sequence of video data values in a buffer and extracting the video data values from the buffer.

4. The computer-implemented method of claim 1, wherein applying data compression to each pixel data stream includes:
   receiving the pixel data streams, each pixel data stream including a plurality of data points, each data point including at least a y value that relates to a successive one of the video data values,
   defining a results array to include a portion of the data points,
   receiving a value for deltay to determine an amount of data compression,
   determining an upper bound line which includes a variable starting data point and an upper delta point, the variable starting data point being any data point in the stream of data points,
   determining a lower bound line which includes the variable starting data point and a lower delta point,
   for each successive current data point that is located between the upper and lower bound lines, performing the following steps:
      determining a successive upper bound line which includes the variable starting data point and a current upper delta point if the current upper delta point is less than a current upper bound point,
      determining a successive lower bound line which includes the variable starting data point and a current lower delta point if the current lower delta point is greater than a current lower bound point, and
      excluding the data point from the results array, and
   for a first successive current data point that is not located between the upper and lower bound lines, performing the following steps:
      retaining the previous data point in the results array,
      determining a new upper bound line which includes the variable starting data point and the current upper delta point, the variable starting data point being updated to the previous data point, and
      determining a new lower bound line which includes the updated variable starting data point and the current lower delta point.

5. The computer-implemented method of claim 4, wherein the results array is output as compressed data for each pixel data stream.

6. The computer-implemented method of claim 1, wherein applying data compression to each pixel data stream includes:
   receiving the pixel data streams, each pixel data stream including a plurality of data points,
   calculating a plurality of differences, each difference being a magnitude of a change between successive adjacent pairs of data points,
   calculating a plurality of difference changes, each difference change being a magnitude of a change between successive adjacent pairs of differences, comparing each difference change to a threshold, and
   for each difference change that is greater than the threshold, outputting one data point associated with the difference change as compressed data.

7. The computer-implemented method of claim 6, further comprising calculating each difference as an absolute value of a first sampled data point minus a second, adjacent sampled data point, and calculating each difference change as an absolute value of a first difference minus a second, adjacent difference.

8. A video data compression system for compressing video data that includes a sequence of video data values, each video data value being a digital value from a successive one of a plurality of pixels that form a frame of video, the sequence of video data values resulting from successive frames of video, the system comprising:
   a pixel data extractor configured to extract the video data values for each pixel in turn to create a plurality of pixel data streams, each pixel data stream including the video data value for each frame of captured video for the pixel; and
   a data compression element configured to compress each pixel data stream to create compressed data for each pixel data stream.

9. The video data compression system of claim 8, further comprising a data buffer configured to store the video data values.

10. The video data compression system of claim 8, further comprising a long term storage memory element configured to store the compressed data for each pixel data stream.

11. The video data compression system of claim 8, wherein the data compression element includes:
   a processing element configured to
      receive the pixel data streams, each pixel data stream including a plurality of data points, each data point including at least a y value that relates to a successive one of the video data values,
      define a results array to include a portion of the data points, receive a value for deltay to determine an amount of data compression, determine an upper bound line which includes a variable starting data point and an upper delta point, the variable starting data point being any data point in the stream of data points, determine a lower bound line which includes the variable starting data point and a lower delta point, for each successive current data point that is located between the upper and lower bound lines, perform the following steps:
- determine a successive upper bound line which includes the variable starting data point and a current upper delta point if the current upper delta point is less than a current upper bound point,
- determine a successive lower bound line which includes the variable starting data point and a current lower delta point if the current lower delta point is greater than a current lower bound point, and
- exclude the data point from the results array, and for a first successive current data point that is not located between the upper and lower bound lines, perform the following steps:
- retain the previous data point in the results array,
- determine a new upper bound line which includes the variable starting data point and the current upper delta point, the variable starting data point being updated to the previous data point, and
- determine a new lower bound line which includes the updated variable starting data point and the current lower delta point.

12. The video data compression system of claim 11, wherein the processing element is further configured to output the results array as compressed data for each pixel data stream.

13. The video data compression system of claim 8, wherein the data compression element includes:
a processing element configured to
- receive the pixel data streams, each pixel data stream including a plurality of data points,
- calculate a plurality of differences, each difference being a magnitude of a change between successive adjacent pairs of data points,
- calculate a plurality of difference changes, each difference change being a magnitude of a change between successive adjacent pairs of differences,
- compare each difference change to a threshold, and
- for each difference change that is greater than the threshold, output one data point associated with the difference change as compressed data.

14. The video data compression system of claim 13, wherein the processing element is further configured to calculate each difference as an absolute value of a first sampled data point minus a second, adjacent sampled data point, and calculate each difference change as an absolute value of a first difference minus a second, adjacent difference.

15. A computer-implemented method for compressing video data, the method comprising:
receiving a sequence of video data values, each video data value being a digital value from a successive one of a plurality of pixels that form a frame of video, the sequence of video data values resulting from successive frames of video;
extracting the video data values for each one of a plurality of clusters of pixels;
applying a mathematical or logic function to each frame of video data for the cluster of pixels to create one of a plurality of pixel cluster data streams, each pixel cluster data stream including the video data value for each frame of captured video for one cluster of pixels; and
applying data compression to each pixel cluster data stream to create compressed data for each pixel cluster data stream.

16. The computer-implemented method of claim 15, further comprising storing the sequence of video data values in a buffer and extracting the video data values from the buffer, and storing the compressed data for each pixel cluster data stream.

17. The computer-implemented method of claim 15, wherein applying data compression to each pixel cluster data stream includes:
receiving the pixel cluster data streams, each pixel cluster data stream including a plurality of data points, each data point including at least a y value that relates to a successive one of the video data values,
defining a results array to include a portion of the data points,
receiving a value for deltay to determine an amount of data compression,
determining an upper bound line which includes a variable starting data point and an upper delta point, the variable starting data point being any data point in the stream of data points,
determining a lower bound line which includes the variable starting data point and a lower delta point,
for each successive current data point that is located between the upper and lower bound lines, performing the following steps:
- determining a successive upper bound line which includes the variable starting data point and a current upper delta point if the current upper delta point is less than a current upper bound point,
- determining a successive lower bound line which includes the variable starting data point and a current lower delta point if the current lower delta point is greater than a current lower bound point, and
- excluding the data point from the results array, and for a first successive current data point that is not located between the upper and lower bound lines, performing the following steps:
- retaining the previous data point in the results array,
- determining a new upper bound line which includes the variable starting data point and the current upper delta point, the variable starting data point being updated to the previous data point, and
- determining a new lower bound line which includes the updated variable starting data point and the current lower delta point.

18. The computer-implemented method of claim 17, wherein the results array is output as compressed data for each pixel cluster data stream.

19. The computer-implemented method of claim 15, wherein applying data compression to each pixel cluster data stream includes:
receiving the pixel cluster data streams, each pixel cluster data stream including a plurality of data points,
calculating a plurality of differences, each difference being a magnitude of a change between successive adjacent pairs of data points, calculating a plurality of difference changes, each difference change being a magnitude of a change between successive adjacent pairs of differences, comparing each difference change to a threshold, and for each difference change that is greater than the threshold, outputting one data point associated with the difference change as compressed data.

20. The computer-implemented method of claim 19, further comprising calculating each difference as an absolute value of a first sampled data point minus a second, adjacent sampled data point, and calculating each difference change as an absolute value of a first difference minus a second, adjacent difference.

* * * * *